United States Patent
Wang et al.

(10) Patent No.: US 9,998,138 B1
(45) Date of Patent: Jun. 12, 2018

(54) TIME-MULTIPLEXED SUCCESSIVE APPROXIMATION REGISTER (SAR) ANALOG-TO-DIGITAL CONVERTER (ADC) CIRCUITS FOR MULTI-CHANNEL RECEIVERS

(71) Applicant: QUALCOMM Incorporated, San Diego, CA (US)

(72) Inventors: Yan Wang, San Diego, CA (US); Chieh-Yu Hsieh, Irvine, CA (US); Ji Ma, Los Angeles, CA (US); Seyed Arash Mirhaj, San Diego, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/711,021

(22) Filed: Sep. 21, 2017

(51) Int. Cl.
  *H03M 1/38* (2006.01)
  *H03M 1/46* (2006.01)
  *H03M 1/12* (2006.01)
  *H03M 1/80* (2006.01)

(52) U.S. Cl.
  CPC ......... *H03M 1/462* (2013.01); *H03M 1/1215* (2013.01); *H03M 1/46* (2013.01); *H03M 1/804* (2013.01)

(58) Field of Classification Search
  CPC .......... H03M 1/462; H03M 1/12; H03M 1/46; H03M 1/1215; H03M 1/804; H03M 1/80
  USPC ....................................... 341/155, 163, 161
  See application file for complete search history.

(56) References Cited

U.S. PATENT DOCUMENTS

| 6,239,734 | B1 * | 5/2001 | Bae ........................ | H03M 1/144 341/163 |
| 6,763,072 | B1 * | 7/2004 | Matsui ................ | H04L 27/2627 375/260 |
| 7,277,040 | B2 | 10/2007 | Mazhar | |
| 7,903,983 | B2 * | 3/2011 | Takahara ............. | H04B 10/695 398/155 |
| 7,961,819 | B1 * | 6/2011 | Lou ........................ | H04L 1/0631 375/332 |
| 8,274,418 | B2 * | 9/2012 | Koli ...................... | G11C 27/024 341/155 |
| 9,231,524 | B2 * | 1/2016 | Cowley ................... | H03D 7/165 |
| 9,236,878 | B2 | 1/2016 | Bogner et al. | |
| 9,306,790 | B1 | 4/2016 | Strode | |
| 9,503,117 | B2 * | 11/2016 | Lee ........................ | H03M 1/002 |
| 9,638,762 | B2 | 5/2017 | Scherr et al. | |

(Continued)

*Primary Examiner* — Jean B Jeanglaude
(74) *Attorney, Agent, or Firm* — Patterson & Sheridan, L.L.P.

(57) ABSTRACT

Multi-channel receiver circuits implemented with time-multiplexed successive approximation register (SAR) analog-to-digital converter (ADC) circuits and methods for operating such receiver circuits are disclosed. One example receiver circuit generally includes a first multiplexer having a plurality of inputs coupled to a plurality of in-phase (I) receive paths associated with different channels of the receiver circuit, a first SAR ADC circuit having an input coupled to an output of the first multiplexer, a second multiplexer having a plurality of inputs coupled to a plurality of quadrature (Q) receive paths associated with the different channels of the receiver circuit, and a second SAR ADC circuit having an input coupled to an output of the second multiplexer.

30 Claims, 22 Drawing Sheets

(56) References Cited

U.S. PATENT DOCUMENTS

| | | | | |
|---|---|---|---|---|
| 2008/0084922 | A1* | 4/2008 | Kleveland | H04B 1/707 375/211 |
| 2008/0240737 | A1* | 10/2008 | Takahara | H04B 10/695 398/202 |
| 2012/0045023 | A1* | 2/2012 | Casagrande | H04L 27/1525 375/334 |
| 2013/0080093 | A1 | 3/2013 | Yang et al. | |
| 2015/0241523 | A1* | 8/2015 | Scherr | G01R 33/0023 324/244 |
| 2016/0269040 | A1* | 9/2016 | Lee | H03M 1/002 |

* cited by examiner

TIME-MULTIPLEXED SUCCESSIVE APPROXIMATION REGISTER (SAR) ANALOG-TO-DIGITAL CONVERTER (ADC) CIRCUITS FOR MULTI-CHANNEL RECEIVERS

TECHNICAL FIELD

Certain aspects of the present disclosure generally relate to electronic circuits and, more particularly, to time-multiplexed successive approximation register (SAR) analog-to-digital converters (ADCs).

BACKGROUND

Wireless communication networks are widely deployed to provide various communication services such as telephony, video, data, messaging, broadcasts, and so on. A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

A mobile station or a base station may include one or more analog-to-digital converters (ADCs), for converting received, amplified, filtered, and downconverted analog signals to digital signals for additional processing in the digital domain, for example. Several types of ADCs are available, each with varying advantages and disadvantages. For example, a successive approximation register (SAR) ADC may provide an area and power-efficient architecture for low to medium accuracy analog-to-digital conversion applications. A SAR ADC may use a digital-to-analog converter (DAC) and a comparator to approximate a digital value corresponding to an analog input. Another type of ADC referred to as a flash ADC may provide a faster conversion speed at the cost of an exponential increase in power and area consumption.

SUMMARY

Certain aspects of the present disclosure generally relate to multi-channel receiver circuits implemented with time-multiplexed successive approximation register (SAR) analog-to-digital converter (ADC) circuits.

Certain aspects of the present disclosure provide a receiver circuit. The receiver circuit generally includes a first multiplexer having a plurality of inputs coupled to a plurality of in-phase (I) receive paths associated with different channels of the receiver circuit, a first SAR ADC circuit having an input coupled to an output of the first multiplexer, a second multiplexer having a plurality of inputs coupled to a plurality of quadrature (Q) receive paths associated with the different channels of the receiver circuit, and a second SAR ADC circuit having an input coupled to an output of the second multiplexer.

Certain aspects of the present disclosure provide a method for sampling signals in a multi-channel receiver circuit. The method generally includes selecting, with a first multiplexer, a first analog signal from among a plurality of inputs of the first multiplexer, the plurality of inputs of the first multiplexer being coupled to a plurality of I receive paths associated with different channels of the receiver circuit; sampling the first analog signal with a first SAR ADC circuit; selecting, with a second multiplexer, a second analog signal from among a plurality of inputs of the second multiplexer, the plurality of inputs of the second multiplexer being coupled to a plurality of Q receive paths associated with the different channels of the receiver circuit; and sampling the second analog signal with a second SAR ADC circuit.

Certain aspects of the present disclosure provide an apparatus for wireless communications. The apparatus generally includes first means for selecting a first analog signal from among a plurality of inputs of the first means for selecting, the plurality of inputs of the first means for selecting being coupled to a plurality of I receive paths associated with different channels of the apparatus; first means for sampling the first analog signal; second means for selecting a second analog signal from among a plurality of inputs of the second means for selecting, the plurality of inputs of the second means for selecting being coupled to a plurality of Q receive paths associated with the different channels of the apparatus; and second means for sampling the second analog signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
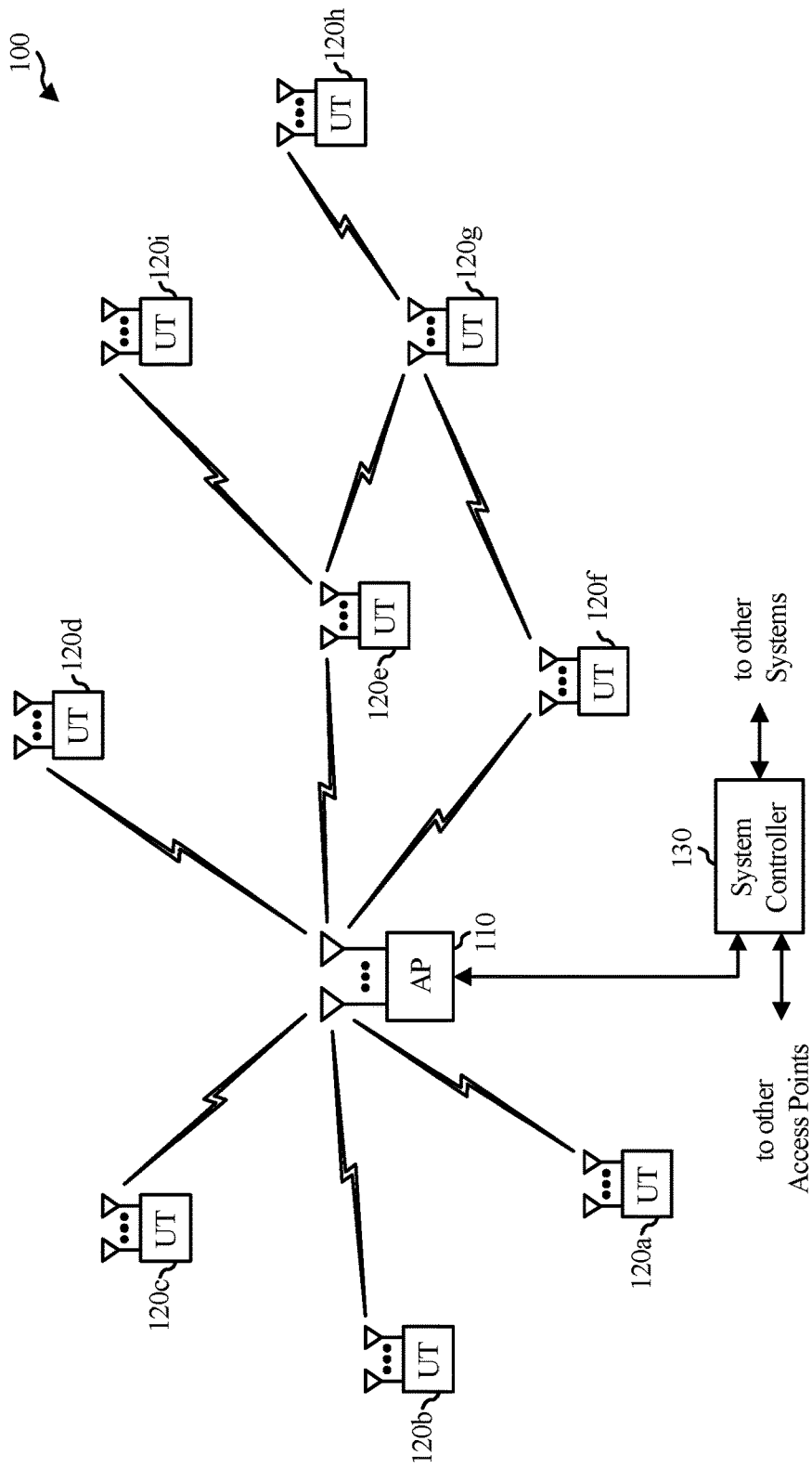
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported).

The access point 110 and/or user terminal 120 may include a multi-channel receiver circuit with multiple analog-to-digital converters (ADCs). The ADCs may be used, for example, to convert in-phase (I) and/or quadrature (Q) baseband analog signals to digital signals for digital signal processing. In certain aspects of the present disclosure, the ADCs may be implemented with time-multiplexed successive approximation register (SAR) ADC circuits, as described in more detail below.

Figure 2:
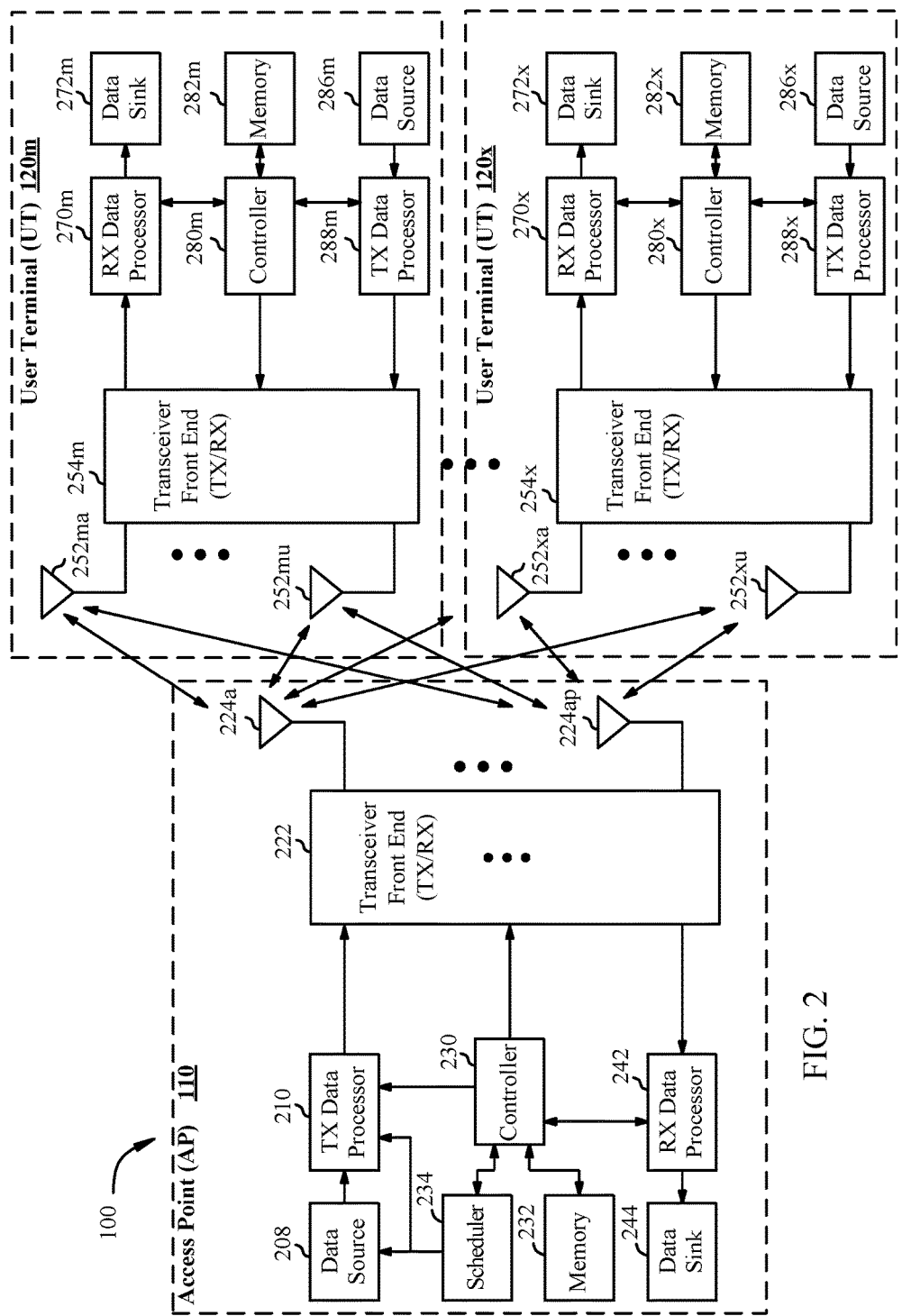
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or the transceiver front end 254 of user terminal 120 may include a multi-channel receiver circuit with multiple ADCs. The ADCs may be used, for example, to convert I and/or Q baseband analog signals to digital signals for digital signal processing. In certain aspects of the present disclosure, the ADCs may be implemented with time-multiplexed SAR ADC circuits, as described in more detail below.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
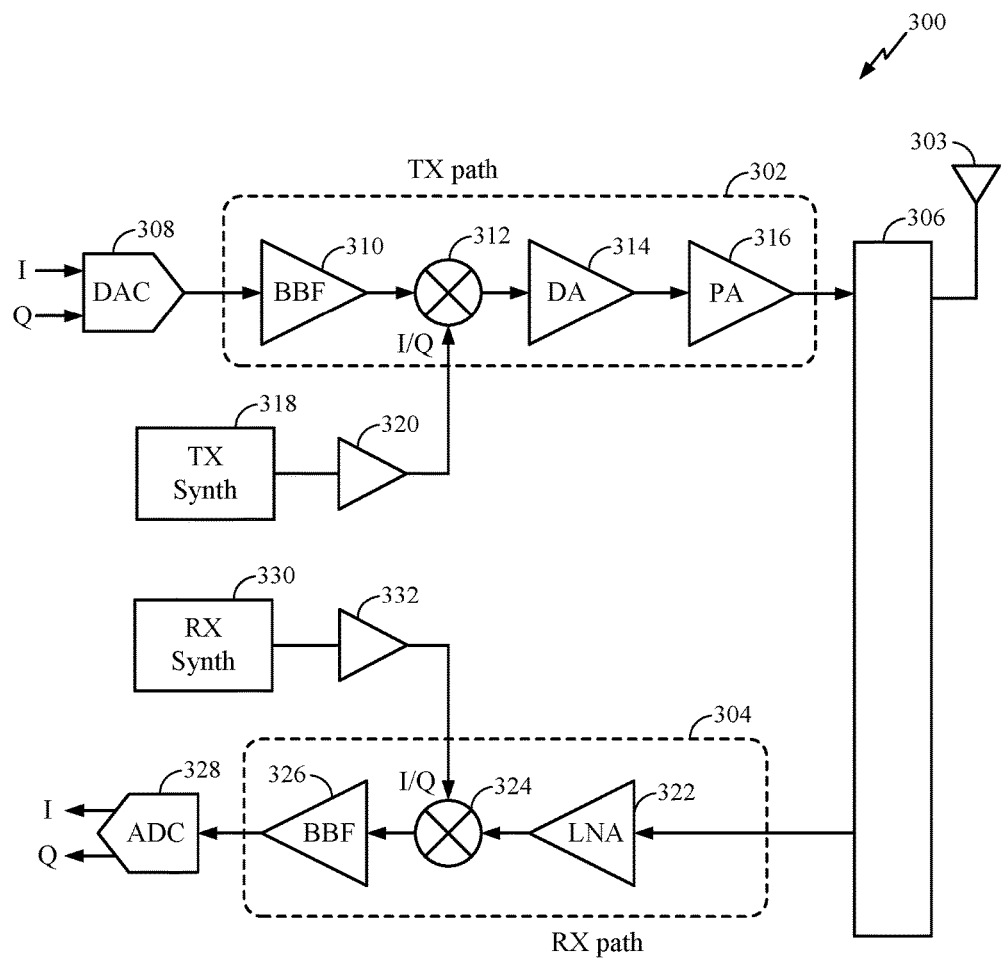
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

In certain aspects of the present disclosure, the transceiver front end 300 may include a multi-channel receiver circuit with multiple ADCs. The ADCs may be used, for example, to convert I and/or Q baseband analog signals to digital signals for digital signal processing. In certain aspects of the present disclosure, the ADCs may be implemented with time-multiplexed SAR ADC circuits, as described in more detail below.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Time-Multiplexed SAR ADC Circuits

Figure 4:
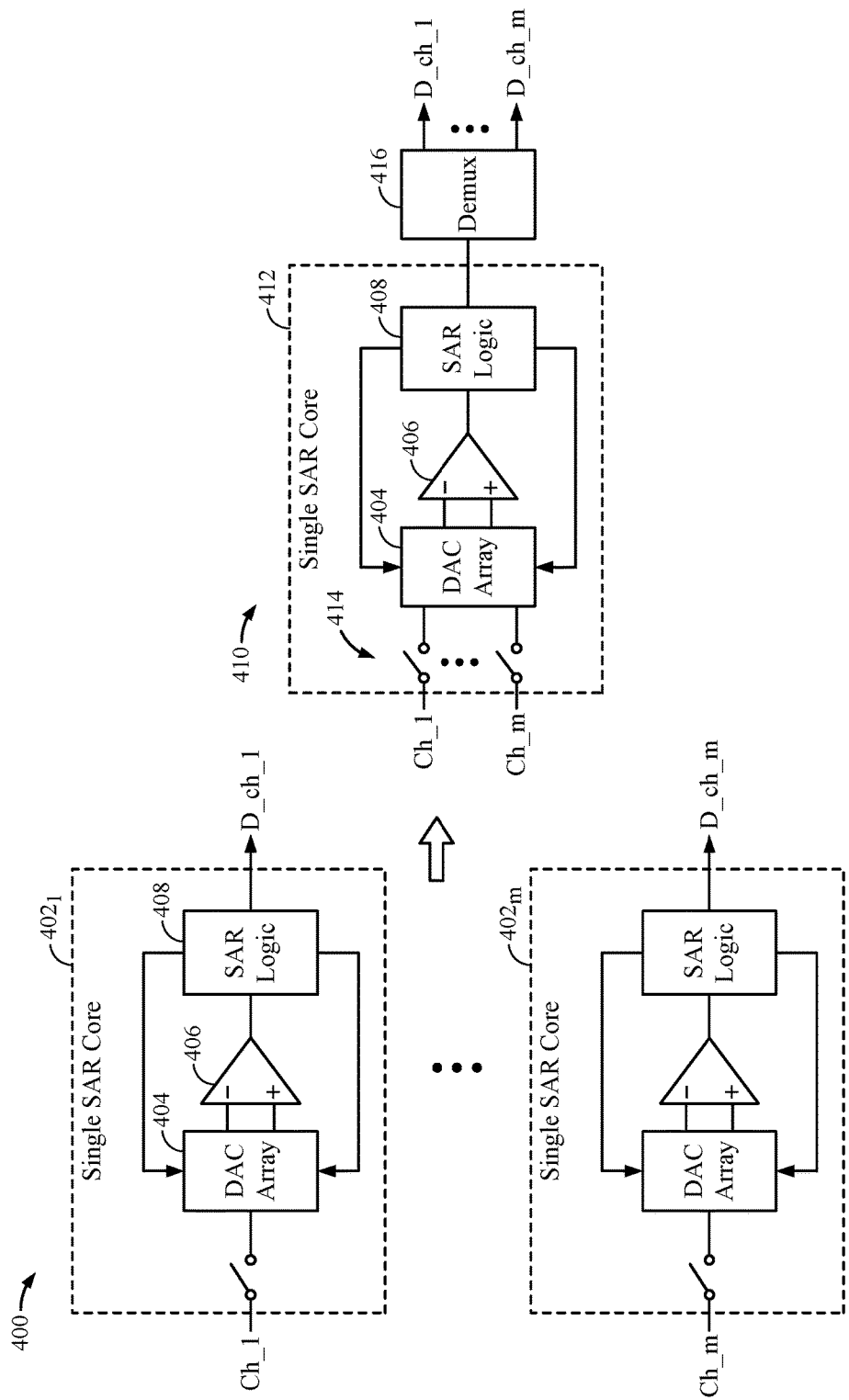
FIG. 4 is a block diagram illustrating time-multiplexing a single successive approximation register (SAR) analog-to-digital converter (ADC) core to process multiple downlink channels, instead of processing each channel with its own SAR ADC core, in accordance with certain aspects of the present disclosure.

In addition to supporting ever more advanced wireless applications, a modern transceiver system usually contains multiple receiver channels to improve the sensitivity (e.g., primary and diversity receiver channels (PRX/DRX)), increase the bandwidth (e.g., carrier aggregation (CA)), support multiple users (e.g., multiple input, multiple output (MIMO)), and/or support multiple standards (e.g., Dual-Band Simultaneous (DBS)). In one existing design, each radio frequency (RF) downlink channel has a dedicated baseband receiver (BBRx) (including, for example, a dedicated successive approximation register (SAR) or delta-sigma analog-to-digital converter (ADC)). For example, FIG. 4 illustrates an example architecture 400 for processing M downlink channels with M SAR ADC circuits 402 (labeled $402_1$ through $402_m$) for sampling and converting baseband analog signals (labeled "Ch_1" through "Ch_m") to digital signals (labeled "D_ch_1" through "D_ch_m"), where M is an integer greater than 1. In other words, each downlink channel has its own dedicated SAR ADC circuit 402.

The total area and/or power budgets of such a design with dedicated ADCs can be significant, especially for a design involving several ADCs. Furthermore, with a modular design that is replicated for the various channels, the BBRx may be overdesigned for particular channels. In the highly competitive wireless communications market, reducing the area and power consumed without expending undue resources on design efforts is typically desirable.

Certain aspects of the present disclosure provide a receiver architecture using one or more time-multiplexing SAR ADCs to process multiple downlink channels. SAR ADCs are different from delta-sigma ADCs, in which the loop filter contains the previous cycle information. In contrast, SAR ADCs sample and convert the input signal every cycle and involve no memory effect from the previous cycle. Since every conversion cycle is independent from other cycles, a single SAR ADC core may be used to support multiple downlink channels in a sequentially time-multiplexed fashion.

For example, FIG. 4 illustrates an example architecture 410 for time-multiplexing a single SAR ADC circuit 412 to process M downlink channels. In addition to the SAR ADC circuit 412, the architecture 410 includes a multiplexing circuit 414 and a demultiplexing circuit 416. As shown in FIG. 4, the multiplexing circuit 414 and/or the demultiplexing circuit 416 may be implemented with a plurality of switches, the operation of which may be controlled by a processing unit (e.g., a controller in a digital signal processor (DSP), which may be included in a modem). Each of the SAR ADC circuits 402, 412 may include a digital-to-analog converter (DAC) array 404, a comparator 406, and a successive approximation register (SAR) with associated logic 408. Since the operation of the DAC array 404, the comparator 406, and the SAR logic 408 is understood by a person having ordinary skill in the art, this operation is not further described herein.

Time-multiplexing can be implemented for in-phase (I) and/or quadrature (Q) paths of the same or different downlink channels. The majority of the SAR analog core may be fully reused, with the exception of the anti-aliasing filter (AAF), sampling switches, and the demultiplexer (demux) logic in certain aspects. For certain aspects, the analog input multiplexer (mux) may be implemented inside the SAR ADC core via the sampling switches. For other aspects, the analog input mux may be implemented separately, outside of the SAR ADC core. In either case, this architecture may be easily converted back to a non-time-multiplexed SAR if other channels are deactivated. Ideally, the multiplexed ADC uses only $1/M^{th}$ of the original area budget for processing M downlink channels with M dedicated ADCs.

Example Multi-Channel Receiver Circuits

FIGS. 5A-5E are related to the same architecture 500 for an example quadrature receiver (Rx) with a SAR ADC circuit 502 for time-multiplexing between an in-phase (I) signal and a quadrature (Q) signal. Although differential I and Q signals are illustrated in FIGS. 5A-5D, the reader will understand that the architecture may alternatively be implemented with single-ended I and Q signals. The reader may wish to refer to the timing diagram 550 of FIG. 5E throughout the description for an example of the timing between the sampling, conversion, and reset phases for each of the I and Q signals (which may also be referred to as I and Q channels (labeled "CH_I" and "CH_Q")). The scheme described below with respect to FIGS. 5A-5E can be easily extended to multiple I/Q channels with time-multiplexed ADCs in concurrently running receive paths.

Figure 5A:
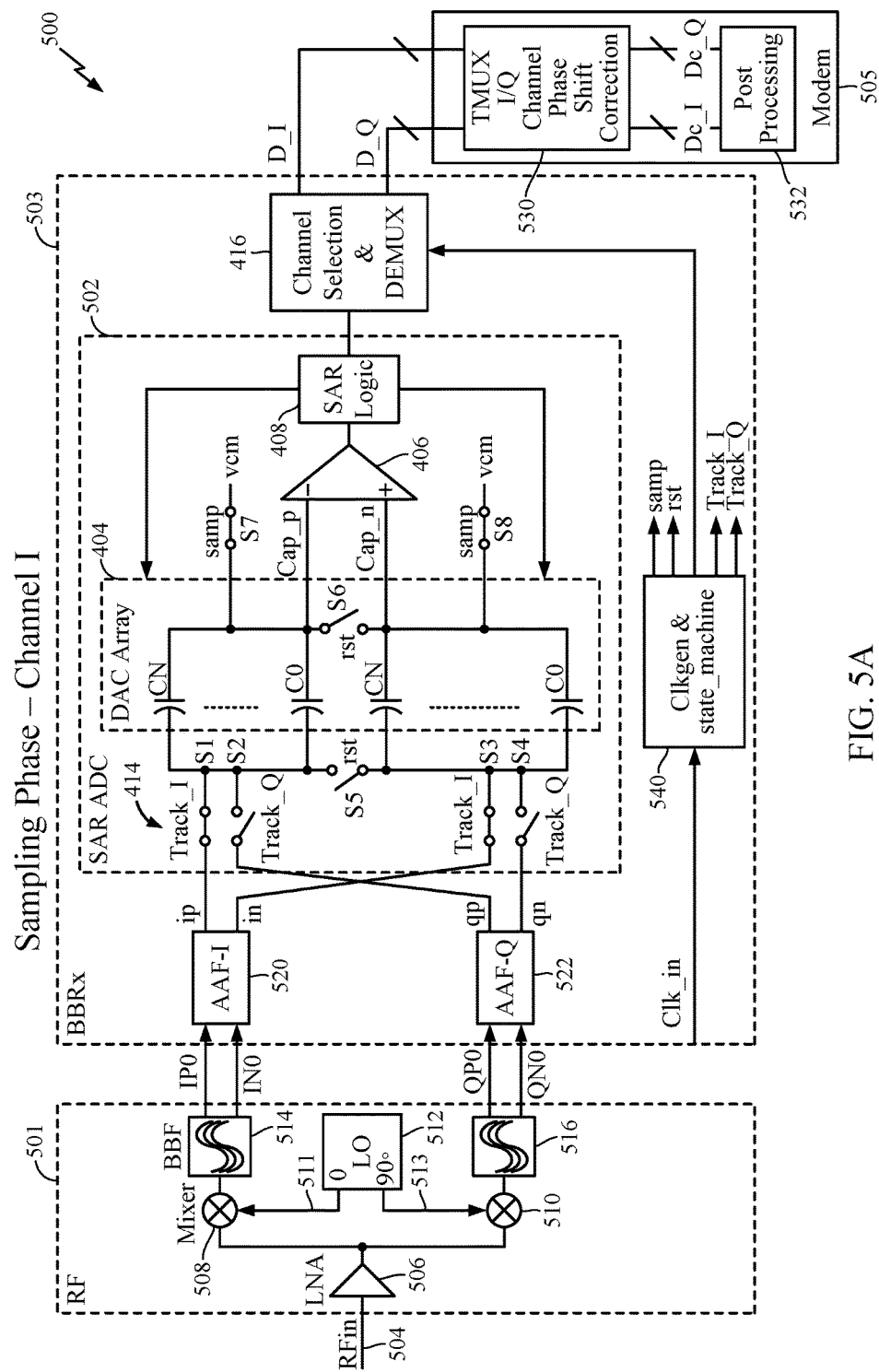
FIG. 5A is a block diagram of an example quadrature receiver using a time-multiplexed SAR ADC circuit during a sampling phase for a differential in-phase (I) signal, in accordance with certain aspects of the present disclosure.

Starting with FIG. 5A, the architecture may include a radio frequency (RF) module 501, a baseband receiver (BBRx) module 503 coupled to the RF module, and a modulator/demodulator (modem) module 505 coupled to the BBRx module. The RF module 501 may include a low noise amplifier (LNA) 506, an in-phase (I) mixer 508, a quadrature (Q) mixer 510, a local oscillator (LO) 512, an I baseband filter (BBF) 514, and a Q BBF 516. The LNA 506, I/Q mixers 508 and 510, and I/Q BBFs 514 and 516 in FIG. 5A may be analogous to the LNA 322, the mixer 324, and the BBF 326 in FIG. 3, respectively. The LO 512 in FIG. 5A may be a frequency synthesizer capable of producing an in-phase (I) LO signal 511 and a quadrature (Q) LO signal 513, which is phase shifted 90° from the I LO signal. The LO 512 may be analogous to the RX frequency synthesizer 330 (and optional amplifier 332) in FIG. 3.

During operation, an RF signal 504 (labeled "RFin") received by an antenna (e.g., antenna 303 in FIG. 3) may be amplified by the LNA 506. The I mixer 508 may mix the amplified RF signal with the I LO signal 511 output by the LO 512 for downconversion, and the I BBF 514 may filter the mixed signal to generate an in-phase (I) baseband signal. The differential I baseband signal has components labeled "IP0" and "IN0," representing positive ("P") and negative ("N") components for the I baseband signal for this particular channel (referred to as Channel 0). Likewise, the Q mixer 510 may mix the amplified RF signal with the Q LO signal 513 output by the LO 512 for downconversion, and the Q BBF 516 may filter the mixed signal to generate a quadrature (Q) baseband signal. The differential Q baseband signal has components labeled "QP0" and "QN0."

The BBRx module 503 may include an anti-aliasing filter in the in-phase path (AAF-I 520), an anti-aliasing filter in the quadrature path (AAF-Q 522), the SAR ADC circuit 502, and the demultiplexing circuit 416. The SAR ADC circuit 502 may include a multiplexing circuit 414, a DAC array 404, a comparator 406, and SAR logic 408 as described above with respect to FIG. 4. The multiplexing circuit 414 may be implemented with a plurality of switches S1, S2, S3, and S4. The DAC array 404 may include N+1 capacitors (labeled "C0" to "CN"). Although drawn as single switches for illustrating the concept in FIG. 4, the reader will understand that each of switches S1, S2, S3, and S4 actually represents a plurality of distributed switches connected with capacitors C0 to CN. The DAC array 404 may be associated with a number of reset switches for the reset phase. FIG. 5A illustrates two reset switches S5 and S6. The DAC array 404 may also be associated with a number of sampling switches for the sampling phase. Two sampling switches S7 and S8 are depicted in the architecture 500 of FIG. 5A.

For certain aspects, the BBRx module 503 may also include a controller 540. For other aspects, the controller 540 may be disposed external to the BBRx module 503. The controller 540 may include a clock generator and a state machine for controlling the state of the various switches, based on the generated clock signal(s). As illustrated in FIG. 5A, the controller 540 has an input for receiving a clock signal ("Clk_in") and outputs for controlling the sampling switches S7 and S8 ("samp"), for controlling the reset switches S5 and S6 ("rst"), for controlling the switches S1 and S3 associated with the I baseband signal components ("Track_I"), and for controlling the switches S2 and S4 associated with the Q baseband signal components ("Track_Q").

During operation of the BBRx module, the AAF-I 520 low-pass filters the I baseband components IP0 and IN0 to generate filtered I baseband signals (labeled "ip" and "in"), and the AAF-Q 522 low-pass filters the Q baseband components QP0 and QN0 to generate filtered Q baseband signals (labeled "qp" and "qn"). During the sampling phase 552 for the I path, the controller 540 asserts the Track_I signal to close switches S1 and S3 as represented in FIGS. 5A and 5E. During this time, the controller 540 also asserts the samp signal such that switches S7 and S8 are closed. Also during this time, the Track_Q signal and the rst signal are deasserted, such that switches S2, S4, S5, and S6 are open. In this manner, the SAR ADC circuit 502 differentially samples the filtered I baseband signal components during the sampling phase 552 for the I path.

Figure 5B:
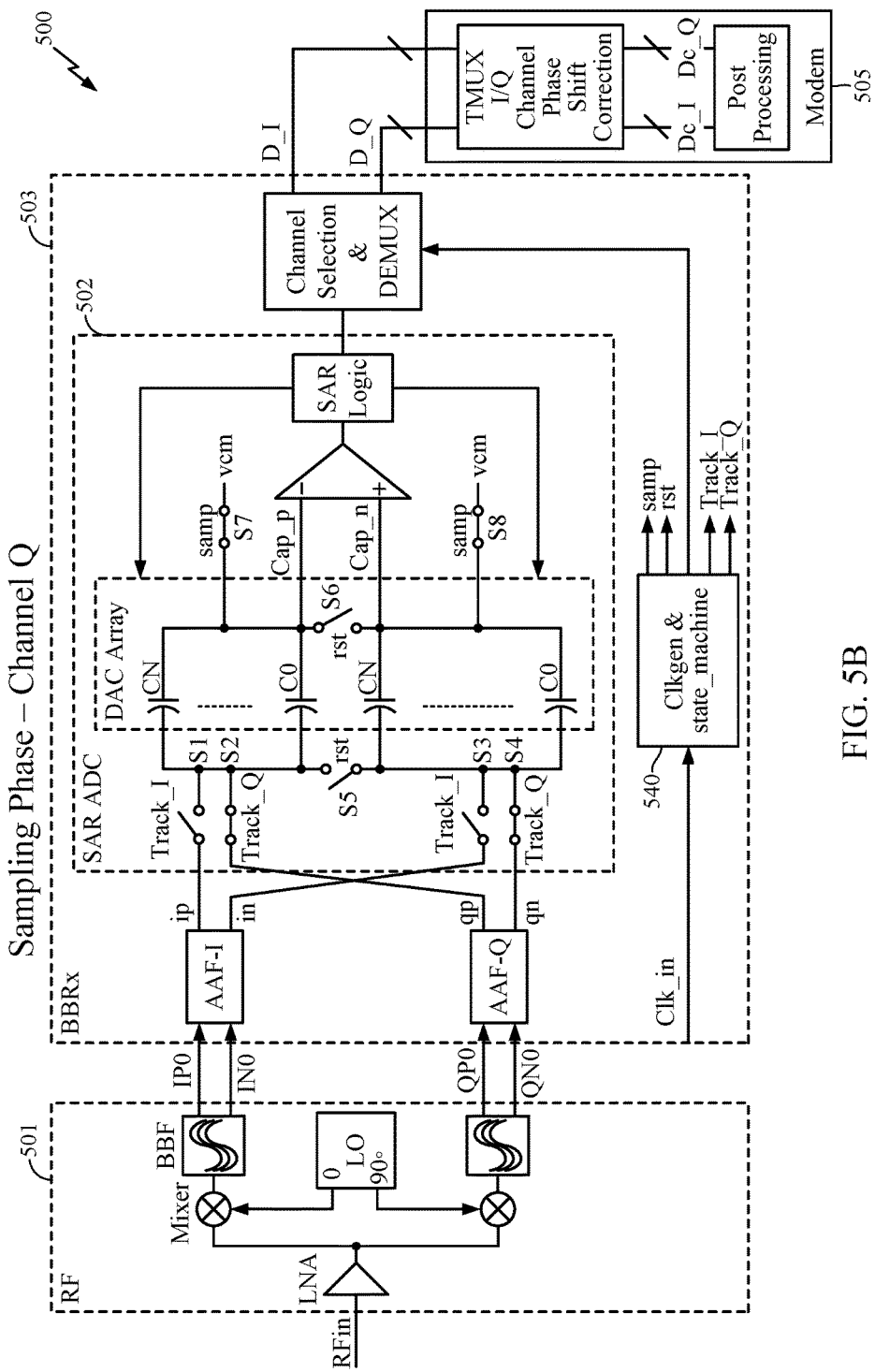
FIG. 5B illustrates the block diagram for the example quadrature receiver of FIG. 5A during a sampling phase for a differential quadrature (Q) signal, in accordance with certain aspects of the present disclosure.
Figure 5C:
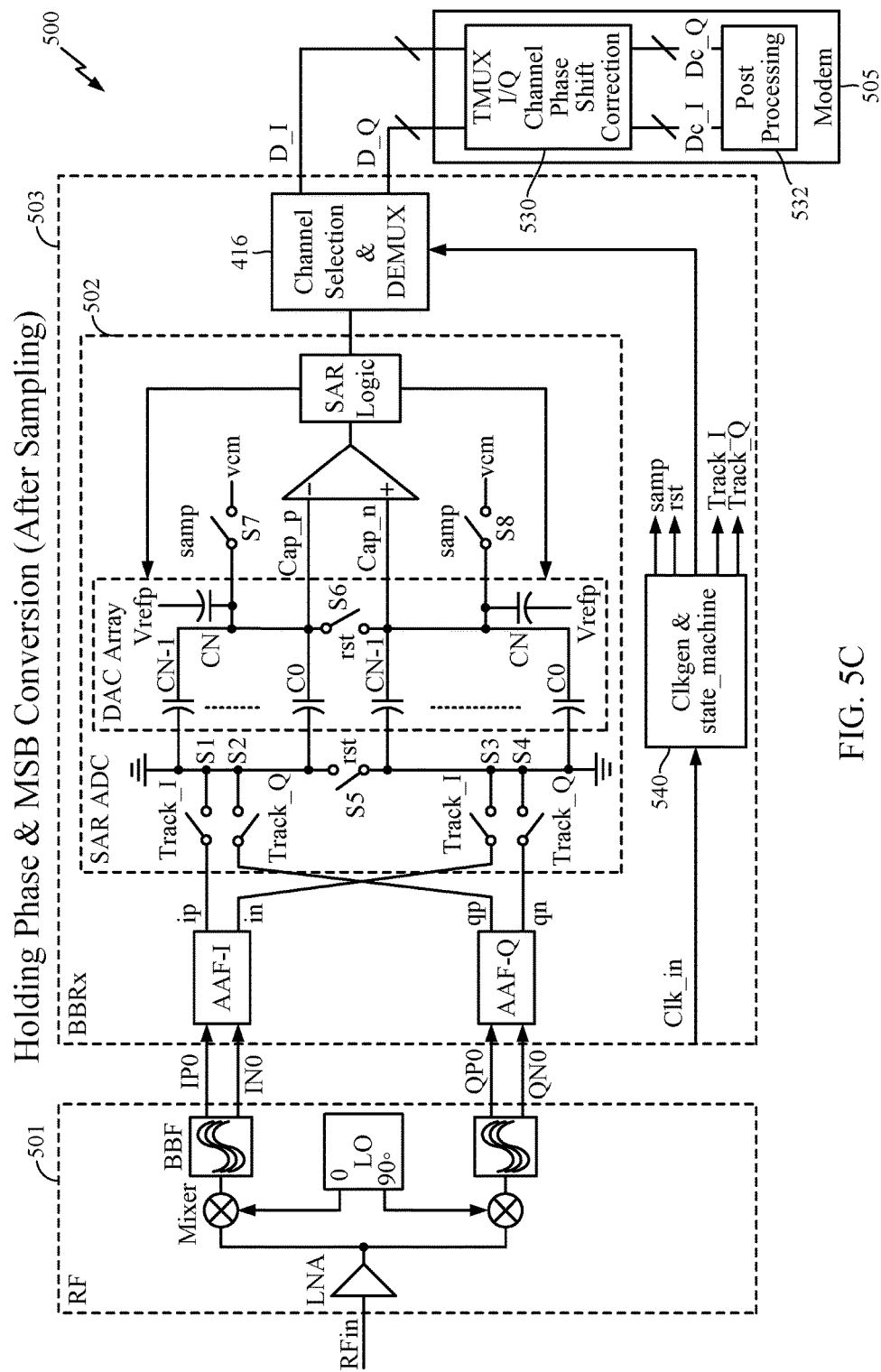
FIG. 5C illustrates the block diagram for the example quadrature receiver of FIG. 5A during a conversion phase, in accordance with certain aspects of the present disclosure.
Figure 5D:
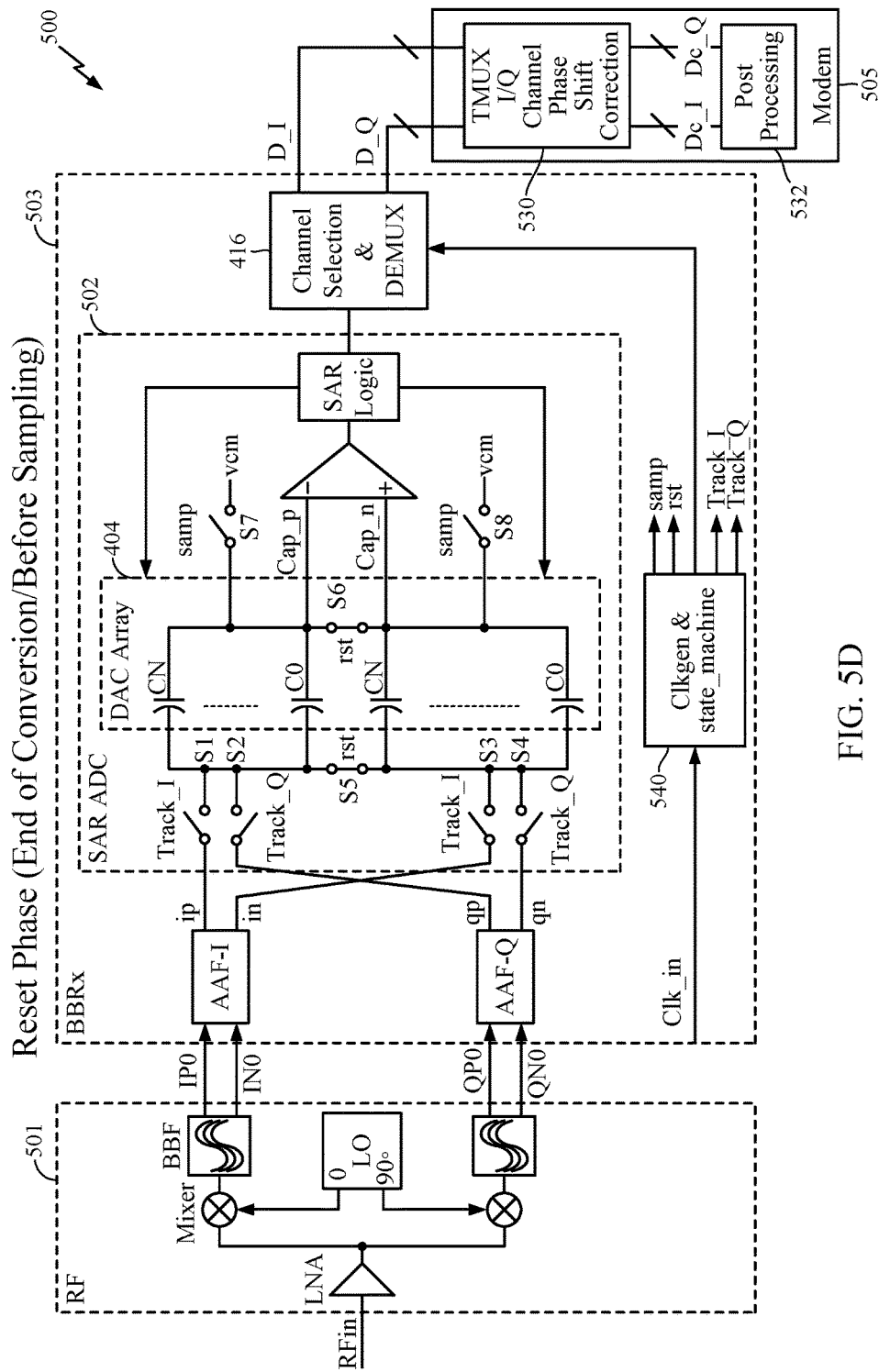
FIG. 5D illustrates the block diagram for the example quadrature receiver of FIG. 5A during a reset phase, in accordance with certain aspects of the present disclosure.
Figure 5E:
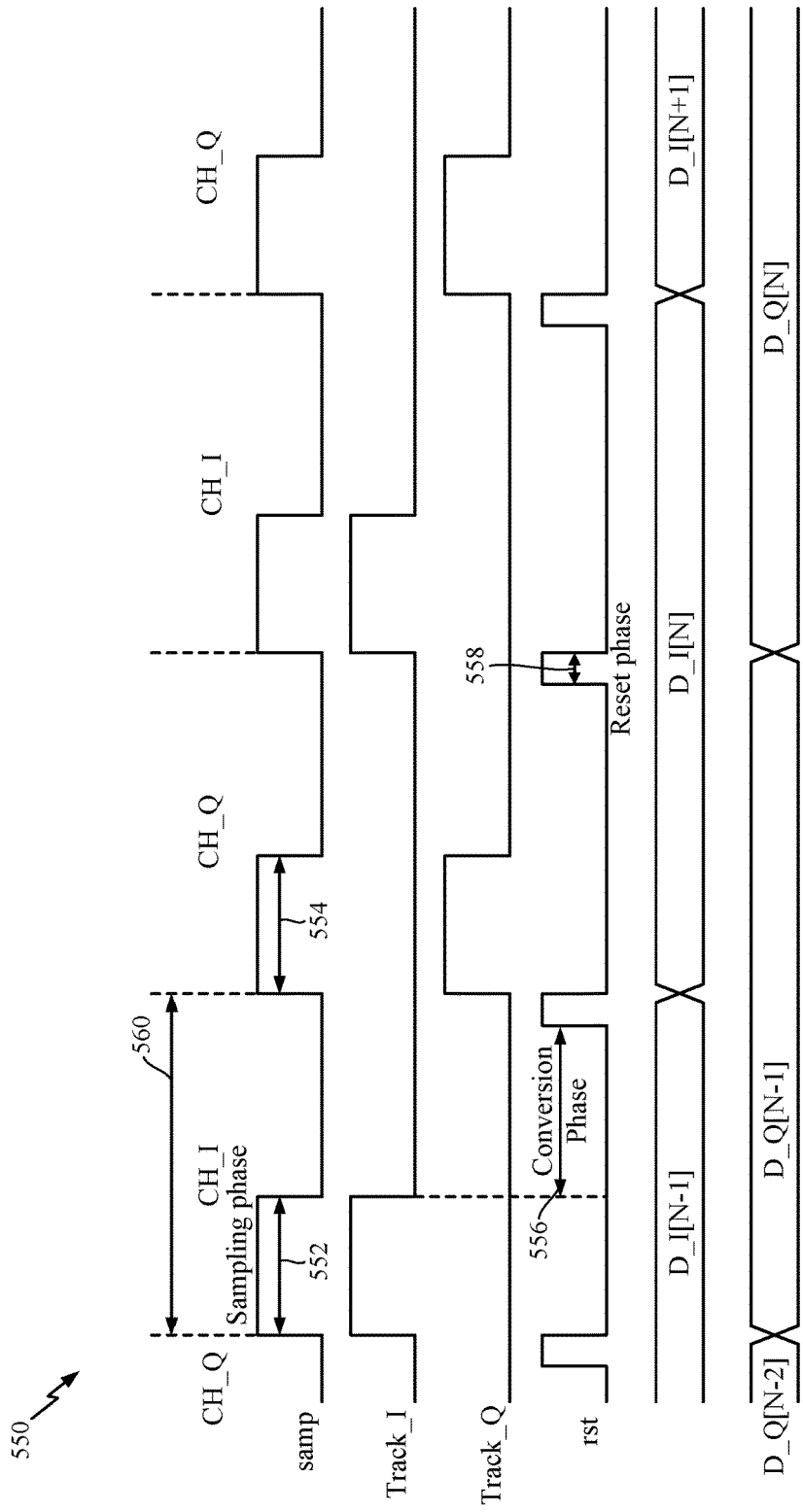
FIG. 5E is an example timing diagram for the example quadrature receiver of FIGS. 5A-5D illustrating the sampling, conversion, and reset phases for both I and Q signals, in accordance with certain aspects of the present disclosure.

During the sampling phase 554 for the Q path, the controller 540 asserts the Track_Q signal to close switches S2 and S4 as represented in FIGS. 5B and 5E. During this time, the controller 540 also asserts the samp signal such that switches S7 and S8 are closed. Also during this time, the Track_I signal and the rst signal are deasserted, such that switches S1, S3, S5, and S6 are open. In this manner, the SAR ADC circuit 502 differentially samples the filtered Q baseband signal components during the sampling phase 554 for the Q path.

During the conversion phase 556 following either the sampling phase 552 for the I path or the sampling phase 554 for the Q path, the controller 540 deasserts the samp, Track_I, Track_Q, and rst signals, as represented in FIG. 5E. In this manner, switches S1, S2, S3, S4, S5, S6, S7, and S8 are all open, as illustrated in FIG. 5C. During the conversion phase 556, the SAR ADC circuit 502 outputs a digital signal representing either the I or Q filtered baseband analog signal.

An input of the demultiplexing circuit 416 is connected to the output of the SAR ADC circuit 502. During operation, the demultiplexing circuit 416 receives the digital I or Q signal (labeled "D_I" or "D_Q") after each conversion phase 556 and outputs these signals to the modem module 505.

The modem module 505 may include I/Q phase adjustment logic 530 and post-processing logic 532. The I/Q phase adjustment logic 530 may be implemented with a phase interpolator or phase delay. Because the I and Q paths for the same downlink channel are sequentially sampled with this time-multiplexed SAR ADC scheme the I/Q phase adjustment logic 530 may be included to correct, or at least adjust, for any change in the signal(s) that occurred during the interval 560 between samples of the I and Q baseband signals. For certain aspects, the interval 560 may be 4.167 ns long, as an example. In FIG. 5E, one can see that the valid data for the current sample of the Q baseband signal (labeled "D_Q[N]") is available approximately one interval 560 after valid data for the current sample of the I baseband signal (labeled "D_I[N]") is available, where the Q baseband signal lags the I baseband signal. For other aspects, the I baseband signal may lag the Q baseband signal, depending on whether the I or Q baseband signal is sampled first. The post-processing logic 532 may include a demodulator for performing demodulation (including quadrature detection, for example) on the phase-adjusted digital I/Q signals to recover the information content from the received RF signal 504.

For certain aspects, a reset phase 558 may follow each conversion phase 556, as illustrated in FIG. 5E. During the reset phase 558, the controller 540 asserts the rst signal, such that the reset switches S5 and S6 are closed as depicted in FIG. 5D. The samp, Track_I, and Track_Q signals remain deasserted during the reset phase 558, such that switches S1, S2, S3, S4, S7, and S8 remain open. In this manner, the capacitors in the DAC array 404 may be discharged before any further sampling. For other aspects, no reset phase is included (i.e., a reset phase may not follow each conversion phase 556). For example, a reset phase may not be implemented if the anti-aliasing filter (e.g., AAF-I 520 or AAF-Q 522) is able to fully settle during the respective sampling phase (e.g., sampling phase 552 or 554).

The sequence of the sampling phase 552 or 554, the conversion phase 556, and the reset phase 558 may be repeated, as illustrated in FIG. 5E. The sum of the time lengths for the sampling phase 552 or 554, the conversion phase 556, and the reset phase 558 may equal the interval 560.

Instead of time multiplexing between I and Q signals of the same channel as described above, certain aspects of the present disclosure involve time multiplexing between two or more different channels (i.e., channel multiplexing) using two concurrently operating time-multiplexed SAR ADC circuits. FIGS. 6A-6G are related to the same architecture 600 for an example receiver circuit with two downlink channels, illustrating channel multiplexing using two time-multiplexed SAR ADC circuits $602_0$ and $602_1$ (collectively "SAR ADC circuits 602"). Although differential I and Q signals are illustrated in FIGS. 6A-6F, the reader will understand that the architecture may alternatively be implemented with single-ended I and Q signals. The reader may wish to refer to the timing diagram 650 of FIG. 6G throughout the description of architecture 600 for an example of the timing between the sampling, conversion and reset phases for each of the channels (labeled "CH0" and "CH1")).

Figure 6A:
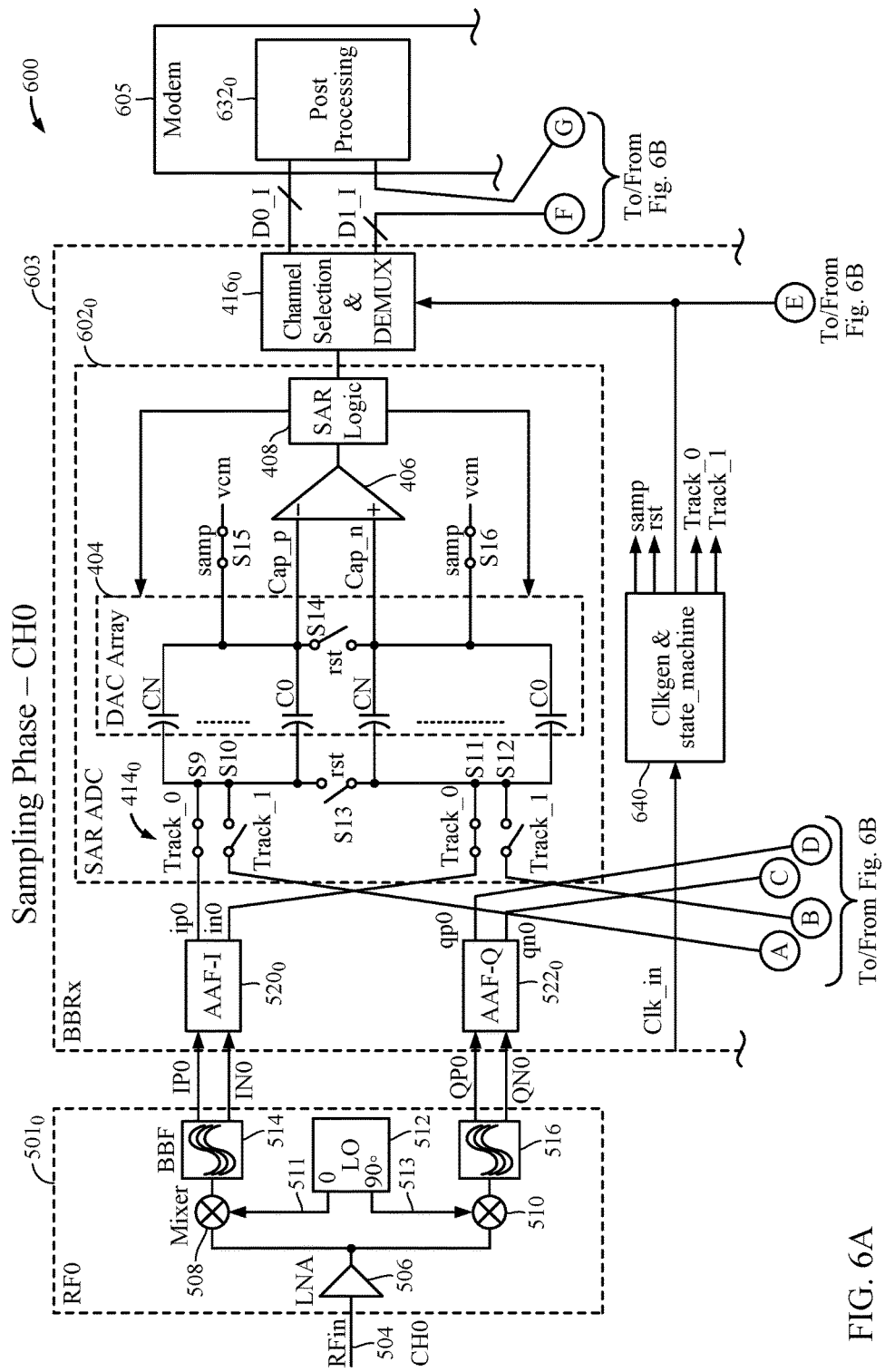
FIGS. 6A and 6B are a block diagram of an example receiver circuit with two downlink channels, illustrating channel multiplexing between two time-multiplexed SAR ADC circuits designated for I and Q signals during a sampling phase, with a separate local oscillator (LO) for each downlink channel, in accordance with certain aspects of the present disclosure.
Figure 6B:
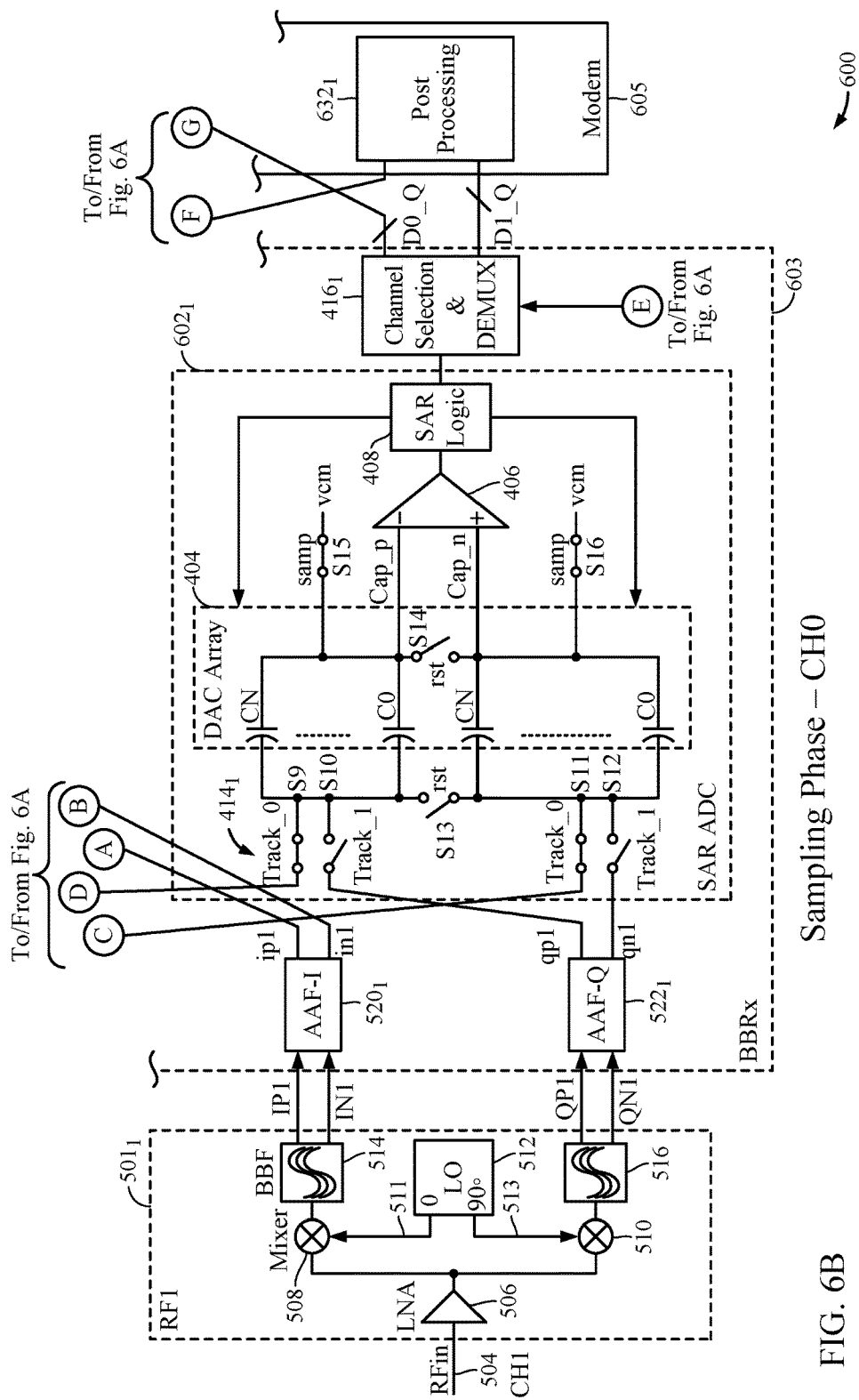

Starting with FIGS. 6A and 6B, the architecture 600 may include one RF module $501_0$ (labeled "RF0") for CH0, one RF module $501_1$ (labeled "RF1") for CH1, a BBRx module 603 coupled to the RF modules $501_0$ and $501_1$, and a modulator/demodulator (modem) module 605 coupled to the BBRx module. Each of the RF modules $501_0$ and $501_1$ may include the same components and operate in the same manner as the RF module 501 in FIG. 5A. In this architecture 600, each channel may have its own LO, separate from the LO of another channel. The RF module $501_0$ for CH0 may output a differential I baseband signal having components labeled "IP0" and "IN0" and a differential Q baseband signal having components labeled "QP0" and "QN0." Similarly, the RF module $501_1$ for CH1 may output a differential I baseband signal having components labeled "IP1" and "IN1" and a differential Q baseband signal having components labeled "QP1" and "QN1."

The BBRx module 603 may include an anti-aliasing filter in the in-phase path for CH0 (AAF-I $520_0$), an anti-aliasing filter in the quadrature path for CH0 (AAF-Q $522_0$), an anti-aliasing filter in the I path for CH1 (AAF-I $520_1$), an anti-aliasing filter in the Q path for CH1 (AAF-Q $522_1$), the SAR ADC circuits 602, a demultiplexing circuit $416_0$ for CH0, and a demultiplexing circuit $416_1$ for CH1. Each of the SAR ADC circuits 602 may include a multiplexing circuit 414, a DAC array 404, a comparator 406, and SAR logic 408 as described above with respect to FIG. 4. Each of the multiplexing circuits $414_0$ and $414_1$ may be implemented with a plurality of switches S9, S10, S11, and S12. Although drawn as single switches for illustrating the concept in FIGS. 6A-6F, the reader will understand that each of switches S9, S10, S11, and S12 actually represents a plurality of distributed switches connected with capacitors C0 to CN. Each DAC array 404 may be associated with a number of reset switches for the reset phase. FIGS. 6A and 6B illustrate two reset switches S13 and S14 in each DAC array 404. Each DAC array 404 may also be associated with a number of sampling switches for the sampling phase. Two sampling switches S15 and S16 in each SAR ADC circuit 602 are depicted in the architecture 600 of FIGS. 6A and 6B.

For certain aspects, the BBRx module 603 may also include a controller 640. For other aspects, the controller 640 may be disposed external to the BBRx module 603. The controller 640 may include a clock generator and a state machine for controlling the state of the various switches, based on the generated clock signal(s). As illustrated in FIGS. 6A and 6B, the controller 640 has an input for receiving a clock signal ("Clk_in") and outputs for controlling the sampling switches S15 and S16 ("samp"), for controlling the reset switches S13 and S14 ("rst"), for controlling the switches S9 and S11 associated with the I/Q baseband signal components for CH0 ("Track_0"), and for controlling the switches S10 and S12 associated with the I/Q baseband signal components for CH1 ("Track_1").

Figure 6C:
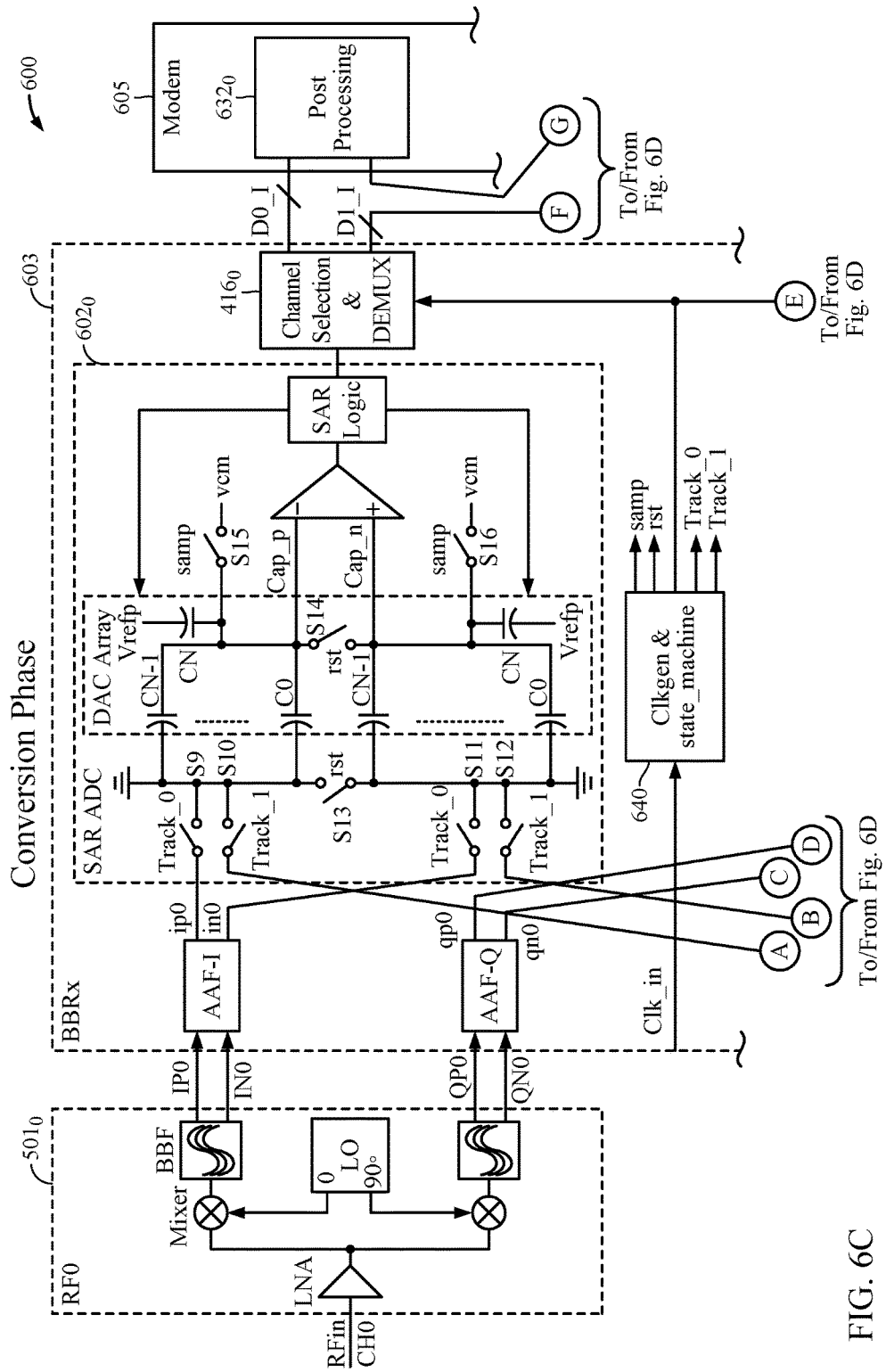
FIGS. 6C and 6D illustrate the block diagram for the example receiver circuit of FIGS. 6A and 6B during a conversion phase, in accordance with certain aspects of the present disclosure.
Figure 6D:
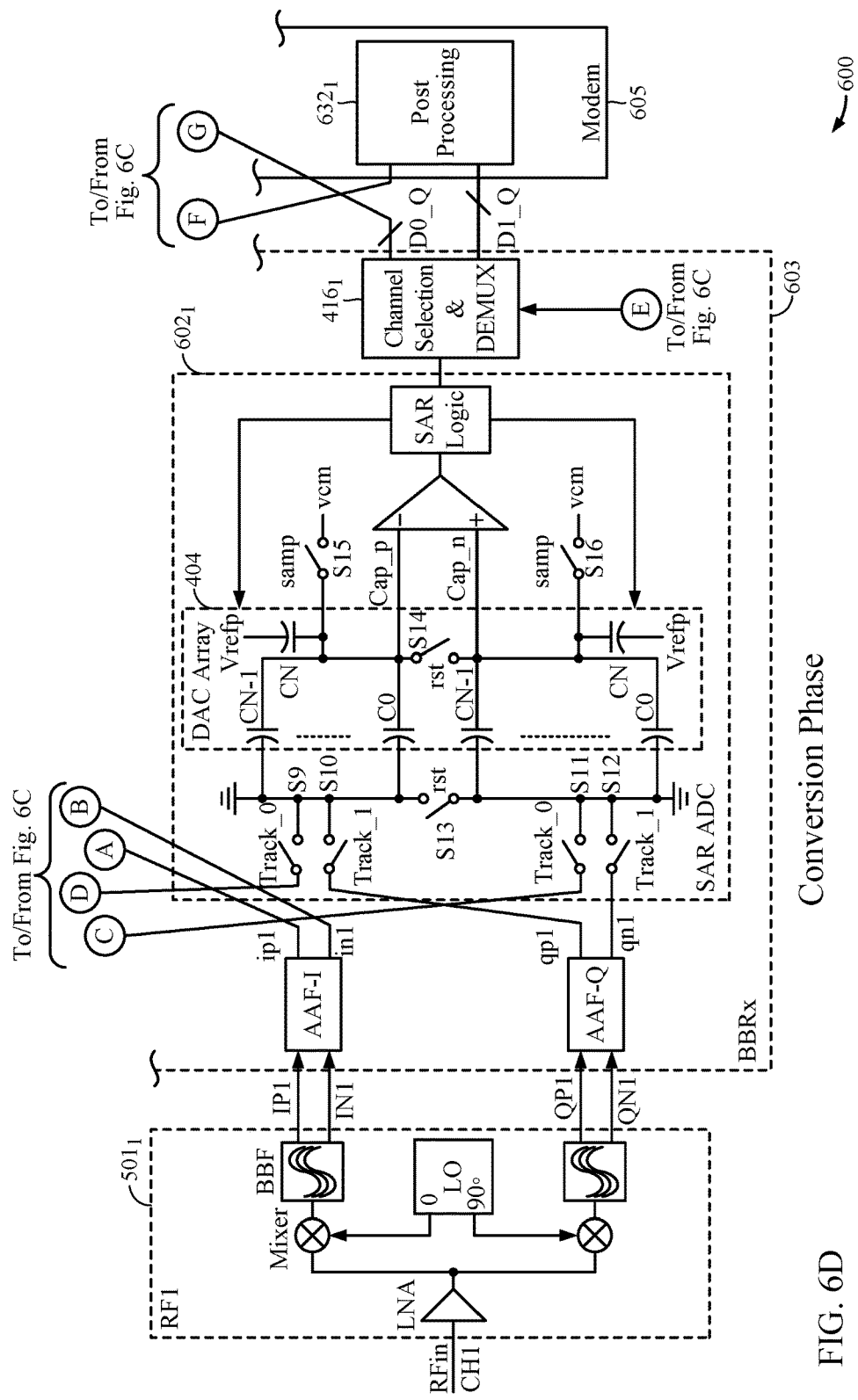
Figure 6E:
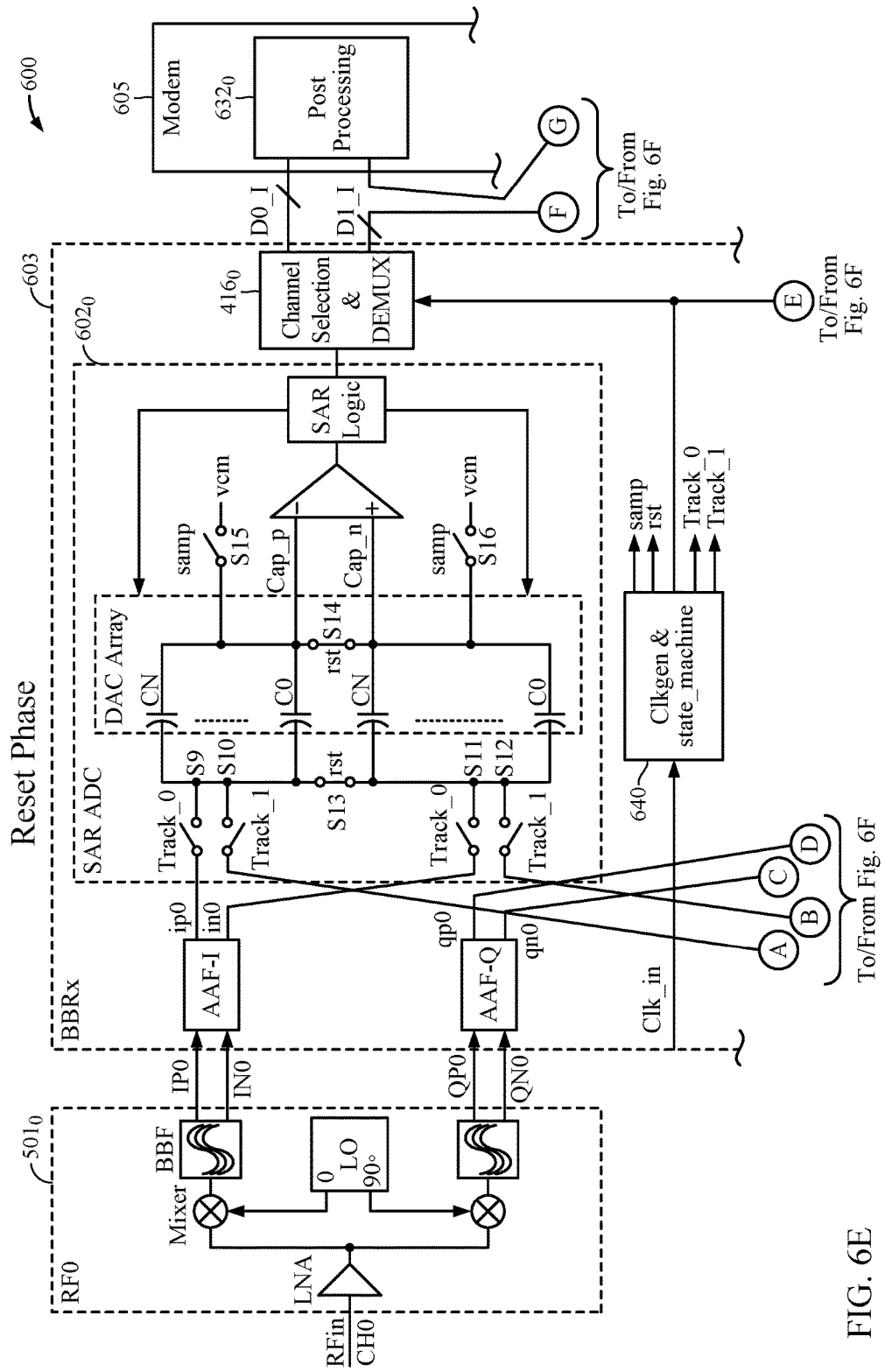
FIGS. 6E and 6F illustrate the block diagram for the example receiver circuit of FIGS. 6A and 6B during a reset phase, in accordance with certain aspects of the present disclosure.
Figure 6F:
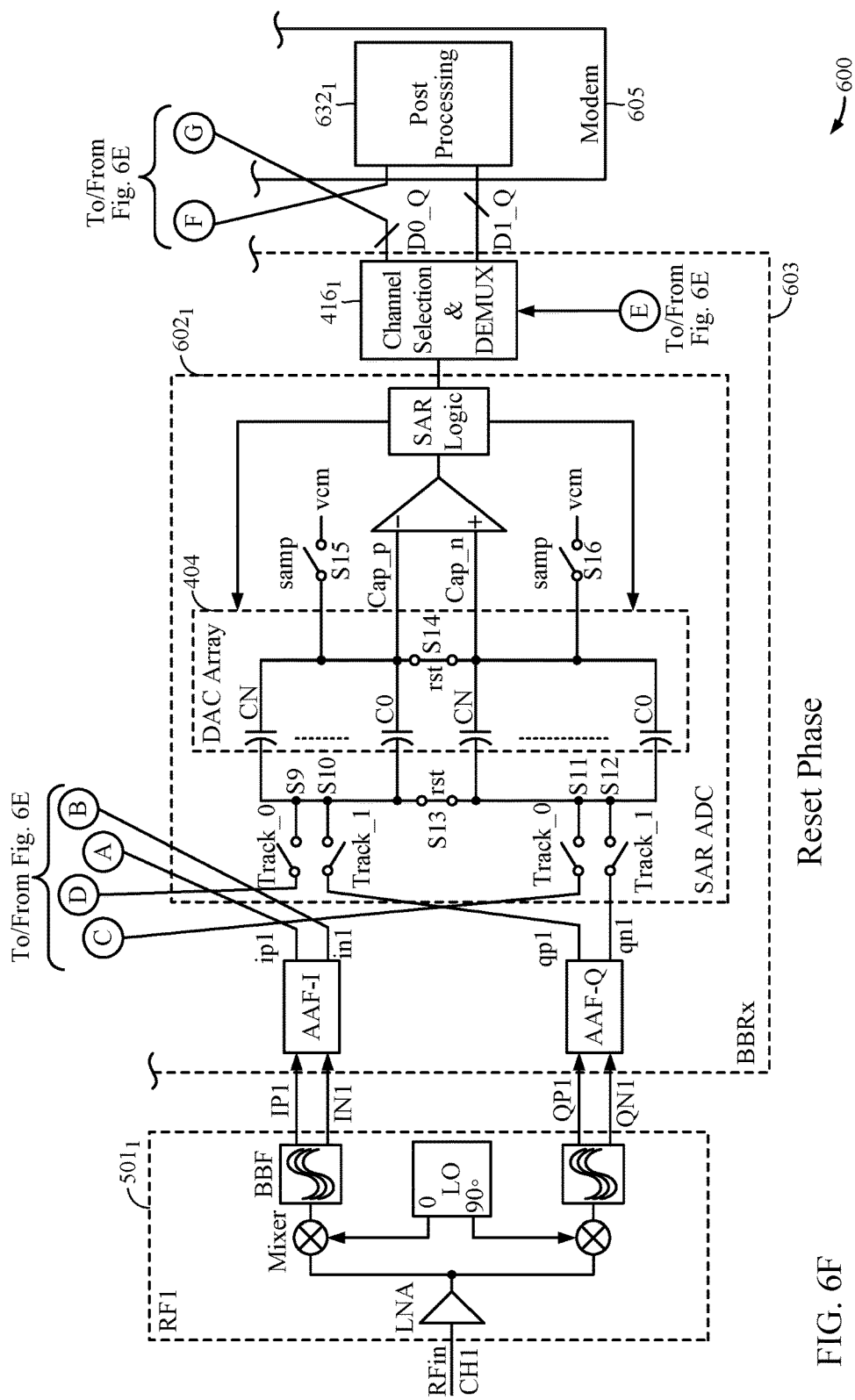
Figure 6G:
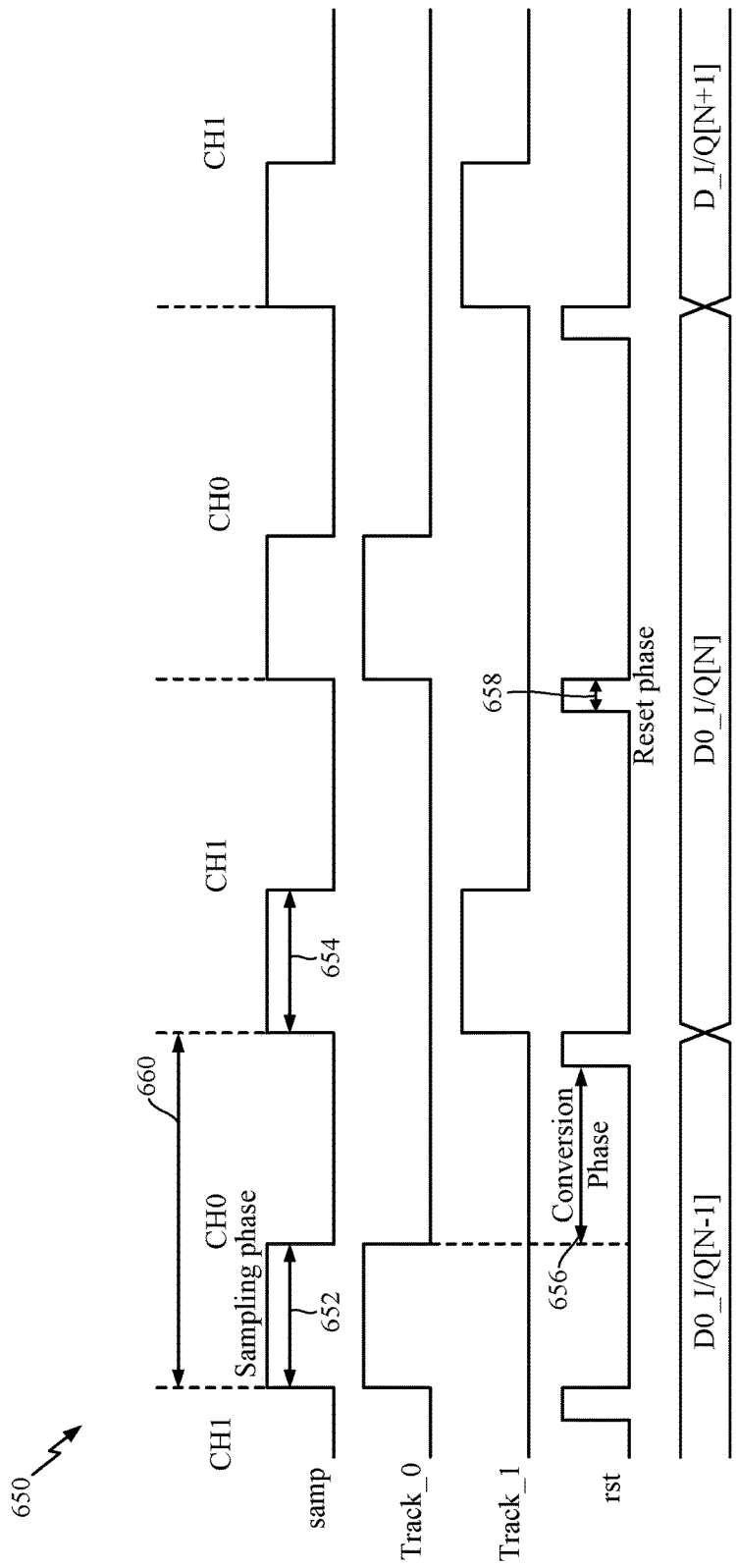
FIG. 6G is an example timing diagram for the example receiver circuit of FIGS. 6A and 6B illustrating the sampling, conversion, and reset phases for both channels, in accordance with certain aspects of the present disclosure.

During operation of the BBRx module 603, the AAF-I $520_0$ may low-pass filter the I baseband components IP0 and IN0 to generate filtered I baseband signals (labeled "ip0" and "in0"), and the AAF-Q $522_0$ may low-pass filter the Q baseband components QP0 and QN0 to generate filtered Q baseband signals (labeled "qp0" and "qn0"). Similarly, the AAF-I $520_1$ may low-pass filter the I baseband components IP1 and IN1 to generate filtered I baseband signals (labeled "ip1" and "in1"), and the AAF-Q $522_1$ may low-pass filter the Q baseband components QP1 and QN1 to generate filtered Q baseband signals (labeled "qp1" and "qn1"). During the sampling phase 652 for CH0 or the sampling phase 654 for CH1, the controller 640 asserts the samp signal such that switches S15 and S16 are closed, as represented in FIGS. 6A, 6B, and 6G. Also during either of these sampling phases 652, 654, the rst signal is deasserted, such that switches S13 and S14 are open for both SAR ADC circuits 602.

During the sampling phase 652 for CH0, the controller 640 also asserts the Track_0 signal to close switches S9 and S11 in both SAR ADC circuits 602, and the Track_1 signal is deasserted such that switches S10 and S12 in both SAR circuits are open (as specifically illustrated by the position of the switches S9-S12 in FIGS. 6A and 6B and by the signals in FIG. 6G). In this manner, the SAR ADC circuit $602_0$ differentially samples the filtered I baseband signal components ip0 and in0, and the SAR ADC circuit $602_1$ differentially samples the filtered Q baseband signal components qp0 and qn0, concurrently during the sampling phase 652 for CH0.

During the sampling phase 654 for CH1, the controller 640 alternatively asserts the Track_1 signal to close switches S10 and S12 in both SAR ADC circuits 602, and the Track_0 signal is deasserted such that switches S9 and S11 in both SAR circuits are open (as represented by the position of the switches S9-S12 in FIGS. 8A and 8B, described below, and illustrated by the signals in FIG. 6G). In this manner, the SAR ADC circuit $602_0$ differentially samples the filtered I baseband signal components ip1 and in1, and the SAR ADC circuit $602_1$ differentially samples the filtered Q baseband signal components qp1 and qn1, concurrently during the sampling phase 654 for CH1.

During the conversion phase 656 following either the sampling phase 652 for CH0 or the sampling phase 654 for CH1, the controller 640 deasserts the samp, Track_I, Track_Q, and rst signals, as represented in FIG. 6G. In this manner, switches S9, S10, S11, S12, S13, S14, S15, and S16 are all open, as illustrated in FIGS. 6C and 6D. During the conversion phase 556, the SAR ADC circuit $602_0$ outputs a digital signal representing the I filtered baseband analog signal for either CH0 or CH1, and the SAR ADC circuit $602_1$ outputs a digital signal representing the Q filtered baseband analog signal for either CH0 or CH1. By sequentially switching between CH0 and CH1, the time-multiplexed SAR ADC circuits 602 may be effectively used to channel multiplex between sampling and converting the I/Q baseband signals of both channels.

An input of the demultiplexing circuit $416_0$ is connected to the output of the SAR ADC circuit $602_0$, and an input of the demultiplexing circuit $416_1$ is connected to the output of the SAR ADC circuit $602_1$. During operation, the demultiplexing circuit $416_0$ may route the digital I signal for CH0 or CH1 (labeled "D0_I" or "D1_I"), and the demultiplexing circuit $416_1$ may route the digital Q signal for CH0 or CH1 (labeled "D0_Q" or "D1_Q"), after each conversion phase 656 to the associated post-processing logic in the modem module 605. The D0_I and D0_Q signals for CH0 may be routed by the demultiplexing circuits $416_0$, $416_1$ to the post-processing logic $632_0$, while the D1_I and D1_Q signals for CH1 may be routed by the demultiplexing circuits $416_0$, $416_1$ to the post-processing logic $632_1$. As described above for post-processing logic 532, post-processing logic $632_0$ and $632_1$ may include demodulators for performing demodulation on the digital I/Q signals to recover the information content from the received RF signals 504 associated with the different downlink channels.

With this time-multiplexed SAR ADC scheme, the I signals from both channels are time-multiplexed in the SAR ADC circuit $602_0$, while the Q signals from both channels are time-multiplexed in the other SAR ADC circuit $602_1$. Because the I and Q paths for the same downlink channel (either CH0 or CH1) are concurrently sampled with this scheme, the architecture 600 need not include any phase adjustment or interpolation logic (e.g., in the modem module 605).

For certain aspects, a reset phase 658 may follow each conversion phase 656, as illustrated in FIG. 6G. During the reset phase 658, the controller 640 asserts the rst signal, such that the reset switches S13 and S14 are closed in both SAR ADC circuits 602 as illustrated in FIGS. 6E and 6F. The samp, Track_0, and Track_1 signals remain deasserted during the reset phase 658, such that switches S9, S10, S11, S12, S15, and S16 remain open in both SAR ADC circuits 602. In this manner, the capacitors in the DAC arrays 404 may be discharged before any further sampling. For other aspects, no reset phase is included (i.e., a reset phase 658 may not follow each conversion phase 656). For example, a reset phase may not be implemented if the anti-aliasing filters are able to fully settle during a respective sampling phase (e.g., sampling phase 652 or 654).

The sequence of the sampling phase 652 or 654, the conversion phase 656, and the reset phase 658 may be repeated, as illustrated in FIG. 6G. The sum of the time lengths for the sampling phase 652 or 654, the conversion phase 656, and the reset phase 658 may equal a multiplexing interval 660. For certain aspects, the multiplexing interval 660 may be the same for both channels, whereas in other aspects, the multiplexing interval for each channel may be different.

Figure 7A:
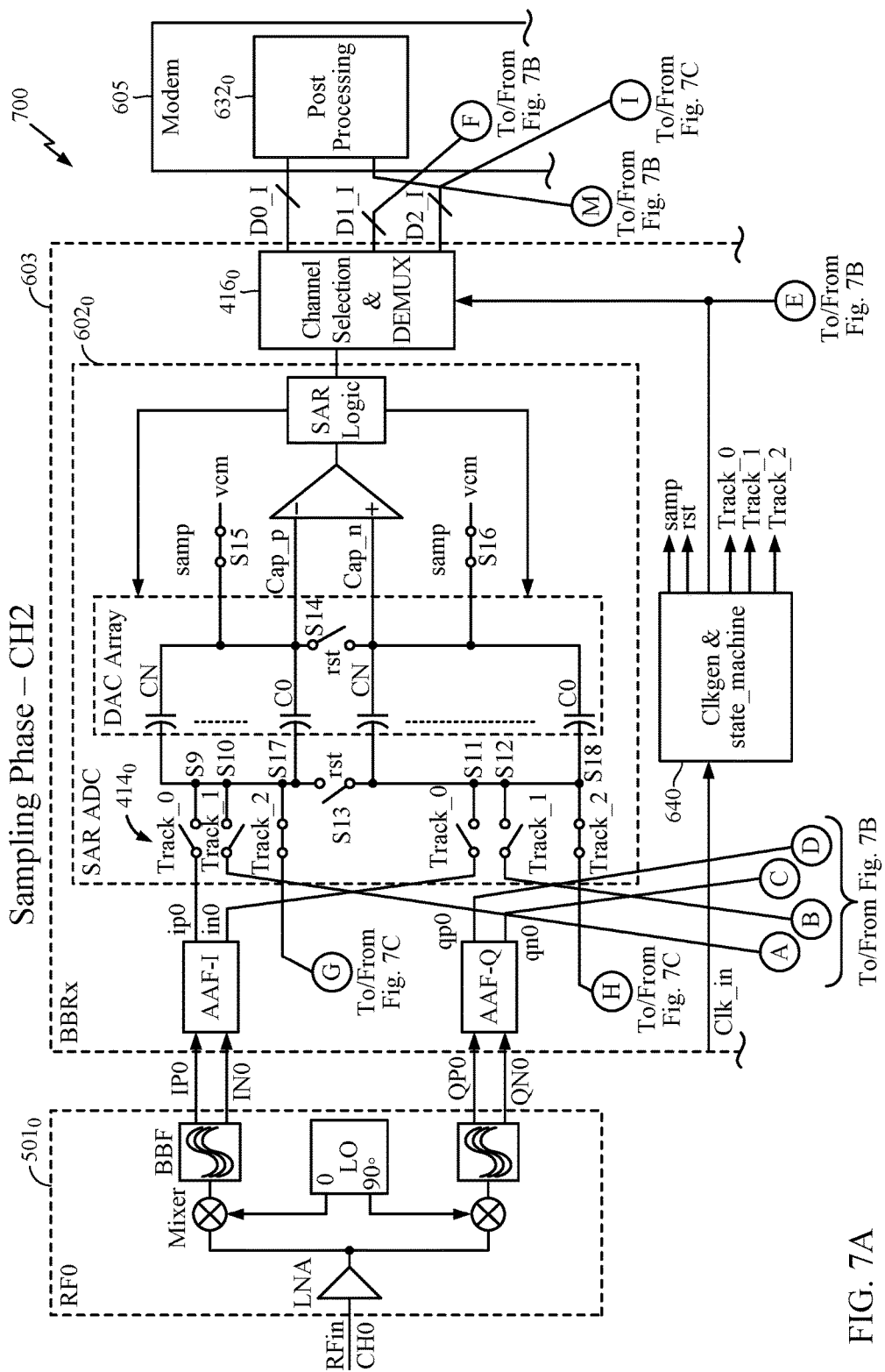
FIGS. 7A-7C are a block diagram of an example receiver circuit, illustrating the example receiver circuit of FIGS. 6A and 6B expanded to three downlink channels during a sampling phase, in accordance with certain aspects of the present disclosure.
Figure 7B:
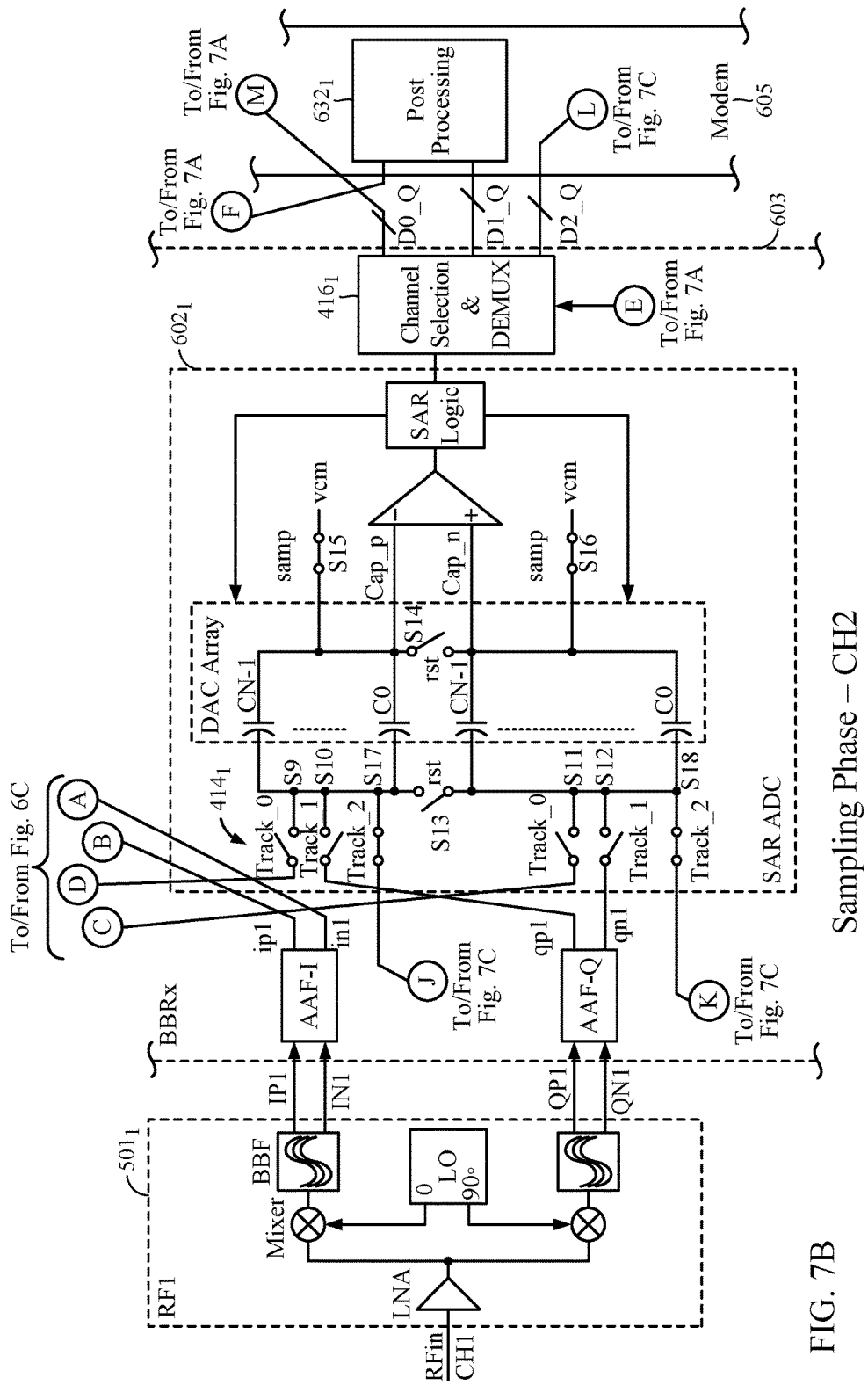
Figure 7C:
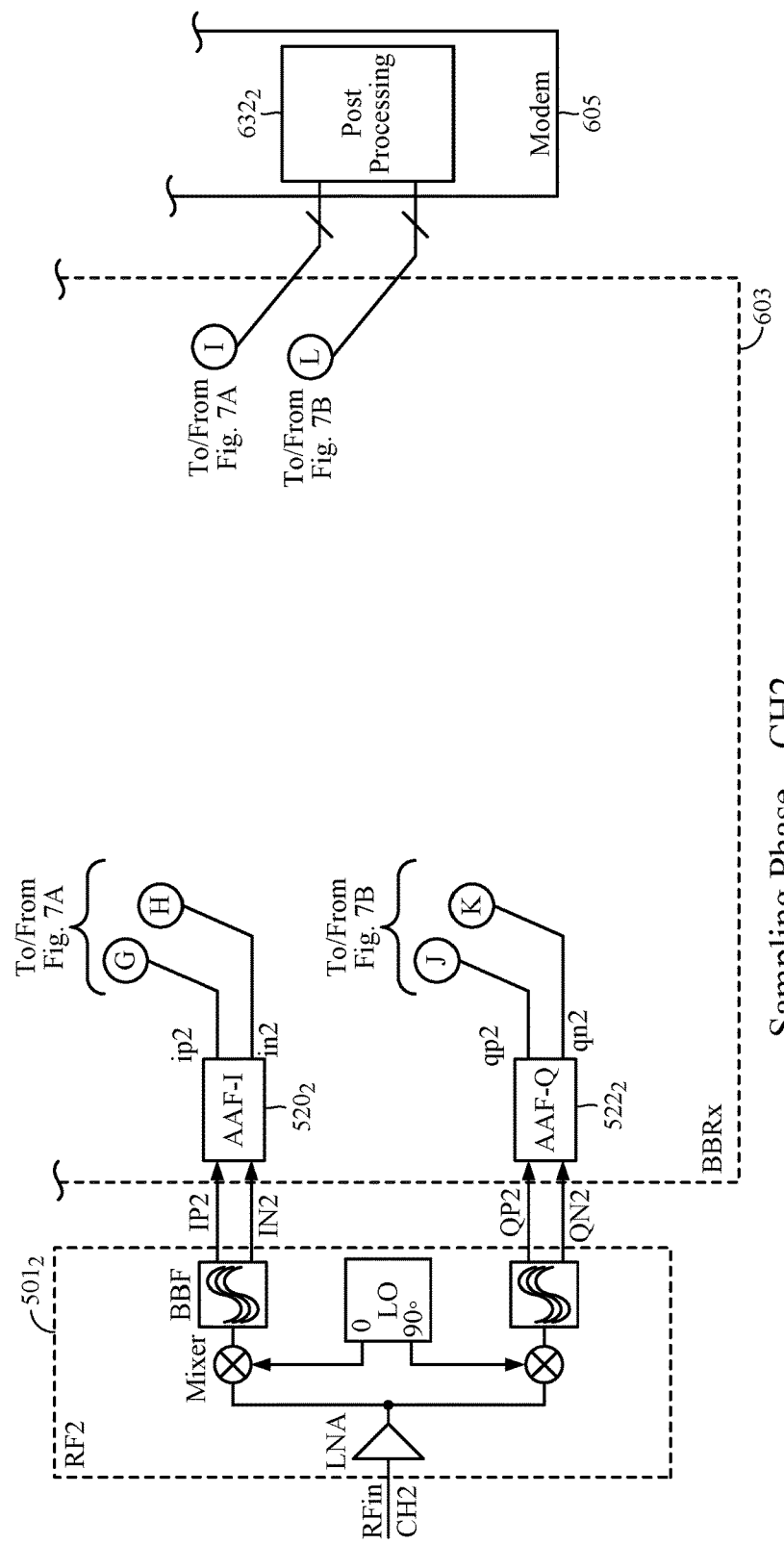

The architecture 600 in FIGS. 6A-6F may be expanded to more than two downlink channels. As an example, FIGS. 7A-7C are a block diagram of an example architecture 700 for a receiver circuit, illustrating the example receiver circuit of FIGS. 6A and 6B expanded to three downlink channels (CH0, CH1, and CH2), in accordance with certain aspects of the present disclosure. The addition of an extra channel (e.g., CH2) may add an extra RF module (e.g., RF module $501_2$, labeled "RF2") for producing another set of differential I/Q baseband signals (e.g., with I components labeled "IP2" and "IN2" and Q components labeled "QP2" and "QN2") and another pair of I/Q anti-aliasing filters (e.g., AAF-I $520_2$ and AAF-Q $522_2$) in the BBRx module 603. The addition of an extra channel may also add another pair of switches (e.g., switches S17 and S18) to each of the multiplexing circuits $414_0$ and $414_1$, another control signal (e.g., Track_2 signal) output from the controller 640 for sampling the extra channel by controlling this pair of switches, an extra digital output signal (e.g., D2_I and D2_Q) from each of the demultiplexing circuits $416_0$ and $416_1$, and additional post-processing logic (e.g., post-processing logic $632_2$) in the modem module 605. Specifically, the positions of the switches shown in FIGS. 7A-7C represent a sampling phase for CH2 for the architecture 700 with the Track_2 signal depicted as being asserted. Although drawn as single switches for illustrating the concept in FIGS. 7A-7C, the reader will understand that each of switches S9, S10, S11, S12, S17, and S18 actually represents a plurality of distributed switches connected with capacitors C0 to CN.

As described above, each of the RF modules $501_0$ and $501_1$ in the architecture 600 (or architecture 700) may include an LO such that each channel may have its own LO, separate from the LO of another channel. For other aspects, two or more RF modules may share an LO. For example, FIGS. 8A and 8B are a block diagram of an example receiver circuit 800, which is based on the architecture 600 of the receiver circuit of FIGS. 6A-6F, but with an LO 812 shared between the various RF modules $501_0$ and $501_1$, in accordance with certain aspects of the present disclosure. Specifically, the positions of the switches shown in FIGS. 8A and 8B represent a sampling phase for CH1 for the receiver circuit 800 with the Track_1 signal shown as being asserted.

Figure 8A:
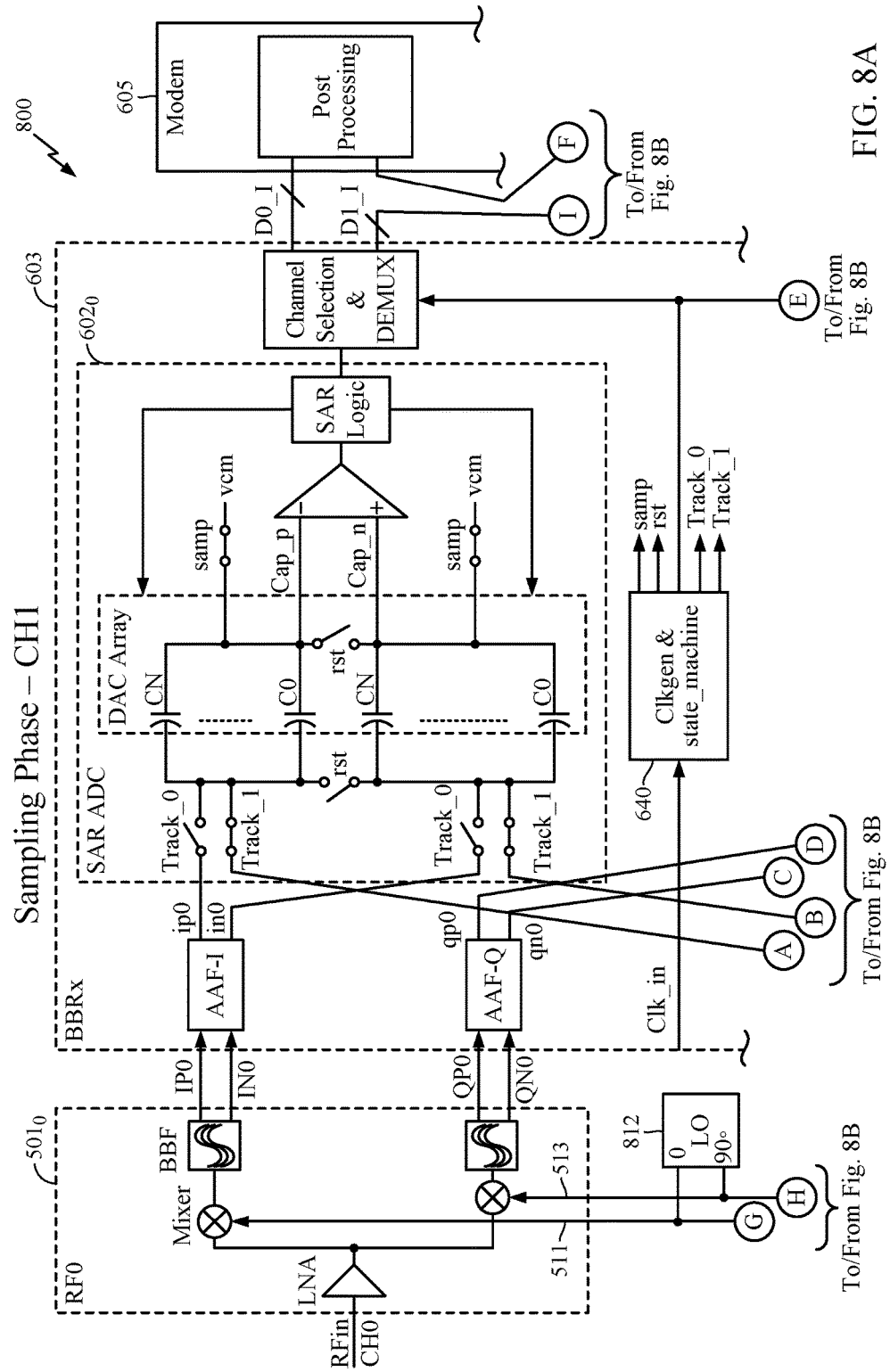
FIGS. 8A and 8B are a block diagram of an example receiver circuit, illustrating the example receiver circuit of FIGS. 6A and 6B during a sampling phase, but with an LO shared between the downlink channels, in accordance with certain aspects of the present disclosure.
Figure 8B:
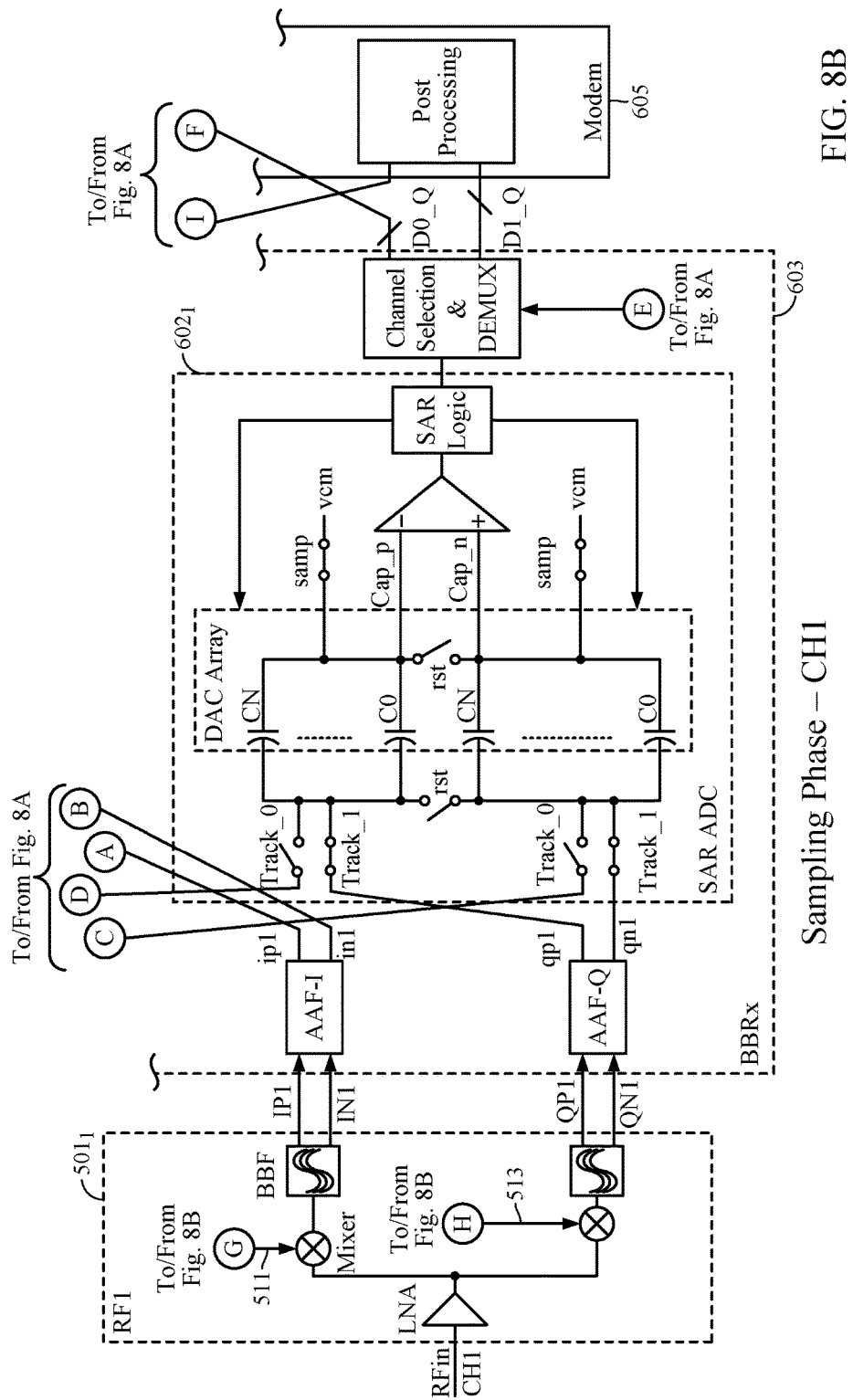
Figure 9:
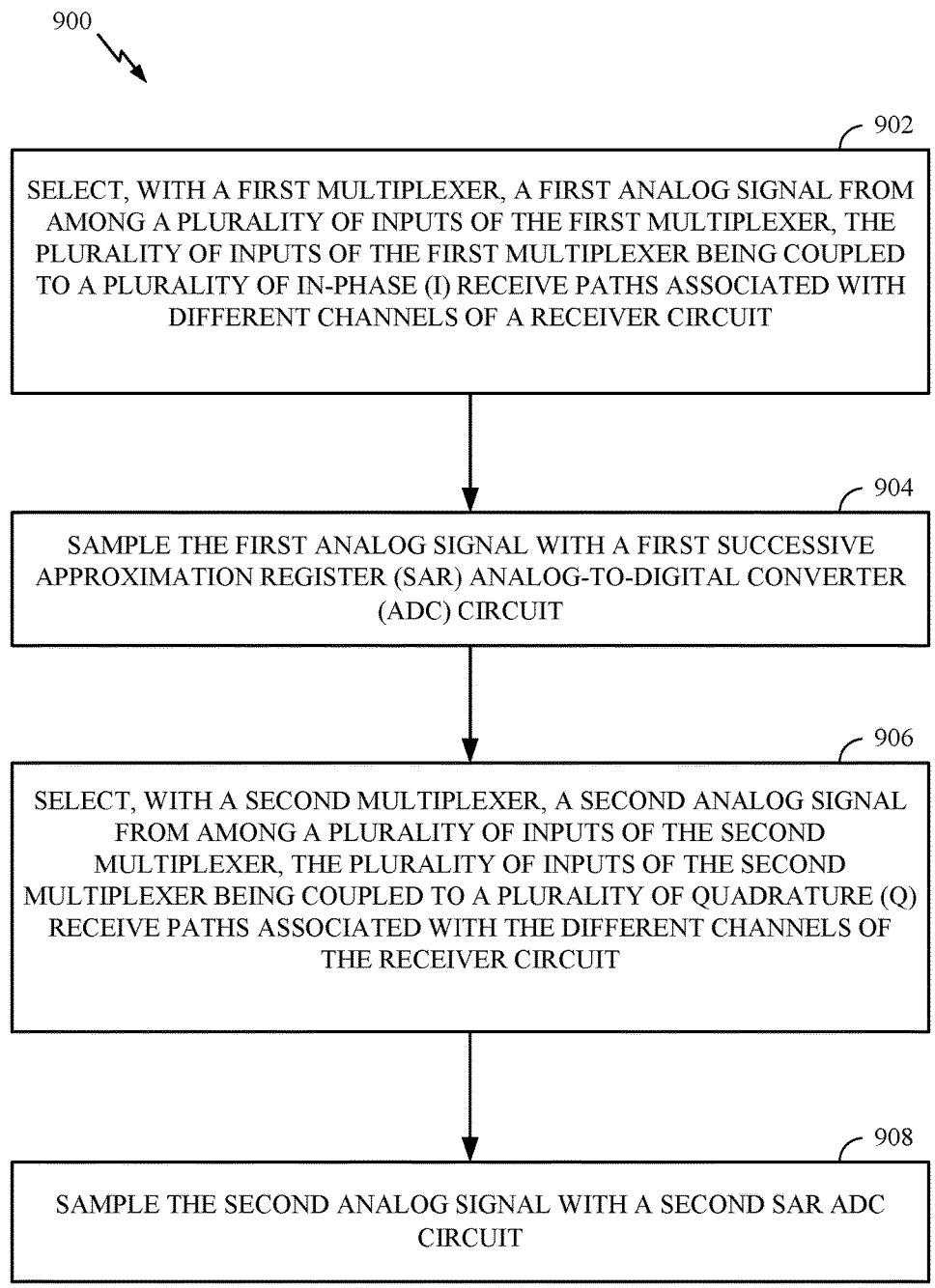
FIG. 9 is a flow diagram of example operations for sampling signals in a multi-channel receiver circuit, in accordance with certain aspects of the present disclosure.

FIG. 9 is a flow diagram illustrating example operations 900 for sampling signals in a multi-channel receiver circuit, in accordance with certain aspects of the present disclosure. The operations 900 may be performed by a receiver circuit, such as the receiver circuit in the architecture 600 of FIGS. 6A-6F, the receiver circuit in the architecture 700 of FIGS. 7A-7C, or the receiver circuit 800 of FIGS. 8A and 8B.

The operations 900 may begin, at block 902, with a first multiplexer (e.g., multiplexing circuit $414_0$) in the receiver circuit selecting a first analog signal (e.g., ip0 or in0) from among a plurality of inputs of the first multiplexer. The plurality of inputs of the first multiplexer are coupled to a plurality of in-phase (I) receive paths associated with different channels (e.g., CH0, CH1, . . . ) of the receiver circuit. At block 904, the first analog signal may be sampled with a first successive approximation register (SAR) analog-to-digital converter (ADC) circuit (e.g., SAR ADC circuit $602_0$) in the receiver circuit. At block 906, a second multiplexer (e.g., multiplexing circuit $414_1$) may select a second analog signal (e.g., qp0 or qn0) from among a plurality of inputs of the second multiplexer. The plurality of inputs of the second multiplexer are coupled to a plurality of quadrature (Q) receive paths associated with the different channels of the receiver circuit. At block 908, the second analog signal may be sampled with a second SAR ADC circuit (e.g., SAR ADC circuit $602_1$).

According to certain aspects, the operations 900 may further involve the first multiplexer selecting a third analog signal (e.g., ip1 or in1) from among the plurality of inputs of the first multiplexer. In this case, the third analog signal may be sampled with the first SAR ADC circuit. For certain aspects, the operations 900 may further include the second multiplexer selecting a fourth analog signal (e.g., qp1 or qn1) from among the plurality of inputs of the second multiplexer. In this case, the fourth analog signal may be sampled with the second SAR ADC circuit. For certain aspects, the operations 900 may further entail the first SAR ADC circuit converting the sampled first signal to a first digital signal (e.g., D0_I), the second SAR ADC circuit converting the sampled second signal to a second digital signal (e.g., D0_Q), the first SAR ADC circuit converting the sampled third signal to a third digital signal (e.g., D1_I), and/or the second SAR ADC circuit converting the sampled fourth signal to a fourth digital signal (e.g., D1_Q). For certain aspects, the operations 900 may further involve a first demultiplexer (e.g., demultiplexing circuit 416$_0$) demultiplexing between the first digital signal and the third digital signal output from the first SAR ADC circuit and a second demultiplexer (e.g., demultiplexing circuit 416$_1$) demultiplexing between the second digital signal and the fourth digital signal output from the second SAR ADC circuit. For certain aspects, the operations 900 may further entail at least one of: (1) resetting the first SAR ADC circuit after converting the sampled first signal and before sampling the third signal; or (2) resetting the second SAR ADC circuit after converting the sampled second signal and before sampling the fourth signal.

According to aspects, the operations 900 may further include the first multiplexer selecting a fifth analog signal (e.g., ip2 or in2) from among the plurality of inputs of the first multiplexer and the first SAR ADC circuit sampling the fifth analog signal. For certain aspects, the operations 900 may further involve the second multiplexer selecting a sixth analog signal (e.g., qp2 or qn2) from among the plurality of inputs of the second multiplexer and the second SAR ADC circuit sampling the sixth analog signal. In this case, the operations 900 may further entail the first SAR ADC circuit converting the sampled first signal to a first digital signal (e.g., D0_I), the second SAR ADC circuit converting the sampled second signal to a second digital signal (e.g., D0_Q), the first SAR ADC circuit converting the sampled third signal to a third digital signal (e.g., D1_I), the second SAR ADC circuit converting the sampled fourth signal to a fourth digital signal (e.g., D1_Q), the first SAR ADC circuit converting the sampled fifth signal to a fifth digital signal (e.g., D2_I), and/or the second SAR ADC circuit converting the sampled sixth signal to a sixth digital signal (e.g., D2_Q). For certain aspects, the operations 900 may further include a first demultiplexer (e.g., demultiplexing circuit 416$_0$) demultiplexing between the first digital signal, the third digital signal, and the fifth digital signal output from the first SAR ADC circuit and a second demultiplexer (e.g., demultiplexing circuit 416$_1$) demultiplexing between the second digital signal, the fourth digital signal, and the sixth digital signal output from the second SAR ADC circuit.

According to certain aspects, the operations 900 further entail mixing a first amplified signal with an in-phase (I) local oscillator (LO) signal (e.g., I LO signal 511) to generate a first intermediate signal, filtering the first intermediate signal to generate the first analog signal, mixing the first amplified signal with a quadrature (Q) LO signal (e.g., Q LO signal 513) to generate a second intermediate signal, and filtering the second intermediate signal to generate the second analog signal. For certain aspects, the operations 900 may further include mixing a second amplified signal with another I LO signal (e.g., I LO signal 511) to generate a third intermediate signal, filtering the third intermediate signal to generate the third analog signal, mixing the second amplified signal with another Q LO signal (e.g., Q LO signal 513) to generate a fourth intermediate signal, and filtering the fourth intermediate signal to generate the fourth analog signal. For other aspects, the operations 900 may further involve mixing a second amplified signal with the I LO signal to generate a third intermediate signal, filtering the third intermediate signal to generate the third analog signal, mixing the second amplified signal with the Q LO signal to generate a fourth intermediate signal, and filtering the fourth intermediate signal to generate the fourth analog signal.

According to certain aspects, the sampling of the first analog signal at block 904 occurs concurrently with the sampling of the second analog signal at block 908.

According to certain aspects, at least one of the first analog signal or the second analog signal comprises a differential signal. For other aspects, the first analog signal and the second analog signal comprise single-ended signals.

Certain aspects of the present disclosure provide a receiver circuit. The receiver circuit generally includes a first multiplexer (e.g., multiplexing circuit 414$_0$) having a plurality of inputs coupled to a plurality of in-phase (I) receive paths associated with different channels (e.g., CH0, CH1, . . . ) of the receiver circuit, a first successive approximation register (SAR) analog-to-digital converter (ADC) circuit (e.g., SAR ADC circuit 602$_0$) having an input coupled to an output of the first multiplexer, a second multiplexer (e.g., multiplexing circuit 414$_1$) having a plurality of inputs coupled to a plurality of quadrature (Q) receive paths associated with the different channels of the receiver circuit, and a second SAR ADC circuit (e.g., SAR ADC circuit 602$_1$) having an input coupled to an output of the second multiplexer.

According to certain aspects, the receiver circuit further includes: (1) a first demultiplexer (e.g., demultiplexing circuit 416$_0$) having a plurality of I outputs and an input coupled to an output of the first SAR ADC circuit and (2) a second demultiplexer (e.g., demultiplexing circuit 416$_1$) comprising a plurality of Q outputs and an input coupled to an output of the second SAR ADC circuit. For certain aspects, the receiver circuit further includes at least one processing unit (e.g., post-processing logic 632$_0$, 632$_1$, and/or 632$_2$) comprising at least one demodulator and a plurality of inputs coupled to the plurality of I outputs of the first demultiplexer and to the plurality of Q outputs of the second demultiplexer. In this case, the receiver circuit may not include a phase adjustment circuit (e.g., I/Q phase adjustment logic 530) coupled between the plurality of I outputs of the first demultiplexer and the at least one demodulator or between the plurality of Q outputs of the second demultiplexer and the at least one demodulator.

According to certain aspects, a first receive chain associated with a first one of the channels (e.g., CH0) generally includes a first amplifier (e.g., LNA 506); a first in-phase (I) mixer (e.g., I mixer 508) having an input coupled to an output of the first amplifier and an output coupled to a first one of the plurality of inputs (e.g., ip0 or in0) of the first multiplexer; a first quadrature (Q) mixer (e.g., Q mixer 510) having an input coupled to the output of the first amplifier and an output coupled to a first one of the plurality of inputs (e.g., qp0 or qn0) of the second multiplexer; and a local oscillator (e.g., LO 512 or 812) having an I output for carrying an I oscillation signal (e.g., I LO signal 511) coupled to another input of the first I mixer and a Q output for carrying a Q oscillation signal (e.g., Q LO signal 513) coupled to another input of the first Q mixer. For certain aspects, a second receive chain associated with a second one of the channels (e.g., CH1) generally includes a second amplifier (e.g., LNA 506), a second I mixer (e.g., I mixer 508) having an input coupled to an output of the second amplifier and an output coupled to a second one of the plurality of inputs (e.g., ip1 or in1) of the first multiplexer, and a second Q mixer (e.g., Q mixer 510) having an input coupled to the output of the second amplifier and an output coupled to a second one of the plurality of inputs (e.g., qp1 or qn1) of the second multiplexer. For certain aspects, the receiver circuit may further include another local oscillator (e.g., LO 512) having: (1) an I output for carrying another I oscillation signal coupled to another input of the second I mixer and (2) a Q output for carrying another Q oscillation signal coupled to another input of the second Q mixer. For certain aspects, the I output of the local oscillator (e.g., LO 812) is coupled to another input of the second I mixer, and the Q output of the local oscillator is coupled to another input of the second Q mixer. For certain aspects, a third receive chain (e.g., in RF module $501_2$) associated with a third one of the channels (e.g., CH2) generally includes a third amplifier (e.g., LNA 506), a third I mixer (e.g., I mixer 508) having an input coupled to an output of the third amplifier and an output coupled to a third one of the plurality of inputs (e.g., ip2 or in2) of the first multiplexer, and a third Q mixer (e.g., Q mixer 510) having an input coupled to the output of the third amplifier and an output coupled to a third one of the plurality of inputs (e.g., qp2 or qn2) of the second multiplexer. For certain aspects, the receiver circuit further includes: (1) a first filter (e.g., BBF 514 and/or AAF-I $520_0$) coupled between the output of the first I mixer and the first one of the plurality of inputs of the first multiplexer and (2) a second filter (e.g., BBF 516 and/or AAF-Q $522_0$) coupled between the output of the first Q mixer and the first one of the plurality of inputs of the second multiplexer.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering.

For example, means for selecting may include a multiplexer, such as multiplexing circuit $414_0$ or $414_1$ as illustrated in FIGS. 6A-6F, 7A-7C, 8A, and 8B. Means for sampling may include an ADC circuit, such as SAR ADC circuit $602_0$ or $602_1$ as shown in FIGS. 6A-6F, 7A-7C, 8A, and 8B. Means for demultiplexing may include a demultiplexer, such as demultiplexing circuit $416_0$ or $416_1$ as illustrated in FIGS. 6A-6F, 7A-7C, 8A, and 8B. Means for resetting may include switches for shorting capacitive elements, such as switches S13 and S14 as depicted in FIGS. 6A-6F, 7A-7C, 8A, and 8B. Means for generating an LO signal may include a frequency synthesizer, which may include a local oscillator (LO) (e.g., LO 512 as illustrated in FIGS. 6A-6F and 7A-7C or LO 812 as shown in FIG. 8A). Means for mixing may include a mixer, such as I mixer 508 or Q mixer 510 as portrayed in FIGS. 6A-6F, 7A-7C, 8A, and 8B. Means for filtering may include a filter, such as a BBF 514 or 516; an AAF-I $520_0$, $520_1$, or $520_2$; and/or an AAF-Q $522_0$, $522_1$, or $522_2$ as depicted in FIGS. 6A-6F, 7A-7C, 8A, and 8B.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A receiver circuit comprising:
   a first multiplexer having a plurality of inputs coupled to a plurality of in-phase (I) receive paths associated with different channels of the receiver circuit;
   a first successive approximation register (SAR) analog-to-digital converter (ADC) circuit having an input coupled to an output of the first multiplexer;
   a second multiplexer having a plurality of inputs coupled to a plurality of quadrature (Q) receive paths associated with the different channels of the receiver circuit; and
   a second SAR ADC circuit having an input coupled to an output of the second multiplexer.

2. The receiver circuit of claim 1, further comprising:
   a first demultiplexer having a plurality of I outputs and an input coupled to an output of the first SAR ADC circuit; and
   a second demultiplexer comprising a plurality of Q outputs and an input coupled to an output of the second SAR ADC circuit.

3. The receiver circuit of claim 2, further comprising at least one processing unit comprising at least one demodulator and a plurality of inputs coupled to the plurality of I outputs of the first demultiplexer and to the plurality of Q outputs of the second demultiplexer.

4. The receiver circuit of claim 3, wherein the receiver circuit does not include a phase adjustment circuit coupled between the plurality of I outputs of the first demultiplexer and the at least one demodulator or between the plurality of Q outputs of the second demultiplexer and the at least one demodulator.

5. The receiver circuit of claim 1, wherein a first receive chain associated with a first one of the channels comprises:
   a first amplifier;
   a first in-phase (I) mixer having an input coupled to an output of the first amplifier and an output coupled to a first one of the plurality of inputs of the first multiplexer;
   a first quadrature (Q) mixer having an input coupled to the output of the first amplifier and an output coupled to a first one of the plurality of inputs of the second multiplexer; and
   a local oscillator having an I output for carrying an I oscillation signal coupled to another input of the first I mixer and a Q output for carrying a Q oscillation signal coupled to another input of the first Q mixer.

6. The receiver circuit of claim 5, wherein a second receive chain associated with a second one of the channels comprises:
- a second amplifier;
- a second I mixer having an input coupled to an output of the second amplifier and an output coupled to a second one of the plurality of inputs of the first multiplexer; and
- a second Q mixer having an input coupled to the output of the second amplifier and an output coupled to a second one of the plurality of inputs of the second multiplexer.

7. The receiver circuit of claim 6, further comprising another local oscillator having:
- an I output for carrying another I oscillation signal coupled to another input of the second I mixer; and
- a Q output for carrying another Q oscillation signal coupled to another input of the second Q mixer.

8. The receiver circuit of claim 6, wherein the I output of the local oscillator is coupled to another input of the second I mixer and wherein the Q output of the local oscillator is coupled to another input of the second Q mixer.

9. The receiver circuit of claim 6, wherein a third receive chain associated with a third one of the channels comprises:
- a third amplifier;
- a third I mixer having an input coupled to an output of the third amplifier and an output coupled to a third one of the plurality of inputs of the first multiplexer; and
- a third Q mixer having an input coupled to the output of the third amplifier and an output coupled to a third one of the plurality of inputs of the second multiplexer.

10. The receiver circuit of claim 5, further comprising:
- a first filter coupled between the output of the first I mixer and the first one of the plurality of inputs of the first multiplexer; and
- a second filter coupled between the output of the first Q mixer and the first one of the plurality of inputs of the second multiplexer.

11. A method of sampling a receiver circuit, comprising:
- selecting, with a first multiplexer, a first analog signal from among a plurality of inputs of the first multiplexer, the plurality of inputs of the first multiplexer being coupled to a plurality of in-phase (I) receive paths associated with different channels of the receiver circuit;
- sampling the first analog signal with a first successive approximation register (SAR) analog-to-digital converter (ADC) circuit;
- selecting, with a second multiplexer, a second analog signal from among a plurality of inputs of the second multiplexer, the plurality of inputs of the second multiplexer being coupled to a plurality of quadrature (Q) receive paths associated with the different channels of the receiver circuit; and
- sampling the second analog signal with a second SAR ADC circuit.

12. The method of claim 11, further comprising:
- selecting, with the first multiplexer, a third analog signal from among the plurality of inputs of the first multiplexer;
- sampling the third analog signal with the first SAR ADC circuit;
- selecting, with the second multiplexer, a fourth analog signal from among the plurality of inputs of the second multiplexer; and
- sampling the fourth analog signal with the second SAR ADC circuit.

13. The method of claim 12, further comprising:
- converting the sampled first analog signal to a first digital signal with the first SAR ADC circuit;
- converting the sampled second analog signal to a second digital signal with the second SAR ADC circuit;
- converting the sampled third analog signal to a third digital signal with the first SAR ADC circuit; and
- converting the sampled fourth analog signal to a fourth digital signal with the second SAR ADC circuit.

14. The method of claim 13, further comprising:
- demultiplexing, with a first demultiplexer, between the first digital signal and the third digital signal output from the first SAR ADC circuit; and
- demultiplexing, with a second demultiplexer, between the second digital signal and the fourth digital signal output from the second SAR ADC circuit.

15. The method of claim 13, further comprising at least one of:
- resetting the first SAR ADC circuit after converting the sampled first analog signal and before sampling the third analog signal; or
- resetting the second SAR ADC circuit after converting the sampled second analog signal and before sampling the fourth analog signal.

16. The method of claim 12, further comprising:
- selecting, with the first multiplexer, a fifth analog signal from among the plurality of inputs of the first multiplexer;
- sampling the fifth analog signal with the first SAR ADC circuit;
- selecting, with the second multiplexer, a sixth analog signal from among the plurality of inputs of the second multiplexer;
- sampling the sixth analog signal with the second SAR ADC circuit;
- converting the sampled first analog signal to a first digital signal with the first SAR ADC circuit;
- converting the sampled second analog signal to a second digital signal with the second SAR ADC circuit;
- converting the sampled third analog signal to a third digital signal with the first SAR ADC circuit;
- converting the sampled fourth analog signal to a fourth digital signal with the second SAR ADC circuit;
- converting the sampled fifth analog signal to a fifth digital signal with the first SAR ADC circuit; and
- converting the sampled sixth analog signal to a sixth digital signal with the second SAR ADC circuit.

17. The method of claim 16, further comprising:
- demultiplexing, with a first demultiplexer, between the first digital signal, the third digital signal, and the fifth digital signal output from the first SAR ADC circuit; and
- demultiplexing, with a second demultiplexer, between the second digital signal, the fourth digital signal, and the sixth digital signal output from the second SAR ADC circuit.

18. The method of claim 12, further comprising:
- mixing a first amplified signal with an in-phase (I) local oscillator (LO) signal to generate a first intermediate signal;
- filtering the first intermediate signal to generate the first analog signal;
- mixing the first amplified signal with a quadrature (Q) LO signal to generate a second intermediate signal; and
- filtering the second intermediate signal to generate the second analog signal.

19. The method of claim 18, further comprising:
mixing a second amplified signal with another I LO signal to generate a third intermediate signal;
filtering the third intermediate signal to generate the third analog signal;
mixing the second amplified signal with another Q LO signal to generate a fourth intermediate signal; and
filtering the fourth intermediate signal to generate the fourth analog signal.

20. The method of claim 18, further comprising:
mixing a second amplified signal with the I LO signal to generate a third intermediate signal;
filtering the third intermediate signal to generate the third analog signal;
mixing the second amplified signal with the Q LO signal to generate a fourth intermediate signal; and
filtering the fourth intermediate signal to generate the fourth analog signal.

21. The method of claim 11, wherein the sampling of the first analog signal occurs concurrently with the sampling of the second analog signal.

22. The method of claim 11, wherein at least one of the first analog signal or the second analog signal comprises a differential signal.

23. An apparatus for wireless communications, comprising:
first means for selecting a first analog signal from among a plurality of inputs of the first means for selecting, the plurality of inputs of the first means for selecting being coupled to a plurality of in-phase (I) receive paths associated with different channels of the apparatus;
first means for sampling the first analog signal;
second means for selecting a second analog signal from among a plurality of inputs of the second means for selecting, the plurality of inputs of the second means for selecting being coupled to a plurality of quadrature (Q) receive paths associated with the different channels of the apparatus; and
second means for sampling the second analog signal.

24. The apparatus of claim 23, wherein:
the first means for selecting is further configured to select a third analog signal from among the plurality of inputs of the first means for selecting;
the first means for sampling is further configured to sample the third analog signal;
the second means for selecting is further configured to select a fourth analog signal from among the plurality of inputs of the second means for selecting; and
the second means for sampling is further configured to sample the fourth analog signal.

25. The apparatus of claim 24, wherein:
the first means for sampling is further configured to convert the sampled first analog signal to a first digital signal using successive approximation;
the second means for sampling is further configured to convert the sampled second analog signal to a second digital signal using successive approximation;
the first means for sampling is further configured to convert the sampled third analog signal to a third digital signal using successive approximation; and
the second means for sampling is further configured to convert the sampled fourth analog signal to a fourth digital signal using successive approximation.

26. The apparatus of claim 25, further comprising:
first means for demultiplexing between the first digital signal and the third digital signal output from the first means for sampling; and
second means for demultiplexing between the second digital signal and the fourth digital signal output from the second means for sampling.

27. The apparatus of claim 25, further comprising at least one of:
first means for resetting the first means for sampling after converting the sampled first analog signal and before sampling the third analog signal; or
second means for resetting the second means for sampling after converting the sampled second analog signal and before sampling the fourth analog signal.

28. The apparatus of claim 24, further comprising:
means for generating an in-phase (I) local oscillator (LO) signal;
means for mixing a first amplified signal with the I LO signal to generate a first intermediate signal;
means for filtering the first intermediate signal to generate the first analog signal;
means for generating a quadrature (Q) LO signal;
means for mixing the first amplified signal with the Q LO signal to generate a second intermediate signal; and
means for filtering the second intermediate signal to generate the second analog signal.

29. The apparatus of claim 28, further comprising:
means for generating another I LO signal;
means for mixing a second amplified signal with the other I LO signal to generate a third intermediate signal;
means for filtering the third intermediate signal to generate the third analog signal;
means for generating another Q LO signal;
means for mixing the second amplified signal with the other Q LO signal to generate a fourth intermediate signal; and
means for filtering the fourth intermediate signal to generate the fourth analog signal.

30. The apparatus of claim 28, further comprising:
means for mixing a second amplified signal with the I LO signal to generate a third intermediate signal;
means for filtering the third intermediate signal to generate the third analog signal;
means for mixing the second amplified signal with the Q LO signal to generate a fourth intermediate signal; and
means for filtering the fourth intermediate signal to generate the fourth analog signal.

\* \* \* \* \*